(12) United States Patent
Mattero et al.

(10) Patent No.: US 12,251,924 B2
(45) Date of Patent: Mar. 18, 2025

(54) SYSTEM AND METHOD FOR ALIGNING A MOVABLE CART TO AN ASSEMBLY APPARATUS

(71) Applicant: Illinois Tool Works Inc., Glenview, IL (US)

(72) Inventors: Patsy A. Mattero, Smithfield, RI (US); William A. Losiewicz, Douglas, MA (US); Kenneth J. King, East Freetown, MA (US)

(73) Assignee: Illinois Tool Works Inc., Glenview, IL (US)

( * ) Notice: Subject to any disclaimer, the term of this patent is extended or adjusted under 35 U.S.C. 154(b) by 658 days.

(21) Appl. No.: 17/571,821

(22) Filed: Jan. 10, 2022

(65) Prior Publication Data

US 2022/0227120 A1    Jul. 21, 2022

Related U.S. Application Data

(60) Provisional application No. 63/138,856, filed on Jan. 19, 2021.

(51) Int. Cl.
*B41F 15/00* (2006.01)
*B41F 15/12* (2006.01)
*H05K 3/12* (2006.01)

(52) U.S. Cl.
CPC ............ *B41F 15/12* (2013.01); *H05K 3/1225* (2013.01)

(58) Field of Classification Search
None
See application file for complete search history.

(56) References Cited

U.S. PATENT DOCUMENTS

| 6,089,812 A * | 7/2000 | Junker | B23Q 7/1436 |
| | | | 414/584 |
| 6,394,743 B1 * | 5/2002 | Marsden | B62B 3/008 |
| | | | 414/812 |

(Continued)

FOREIGN PATENT DOCUMENTS

| EP | 3549766 A1 | 10/2019 |
| WO | 2019225002 A1 | 11/2019 |
| WO | 2020252223 A1 | 12/2020 |

OTHER PUBLICATIONS

Notification of Transmittal of the International Search Report and the Written Opinion of the International Searching Authority from corresponding PCT/US2022/012759 dated Apr. 26, 2022.

*Primary Examiner* — Steven M Marsh
(74) *Attorney, Agent, or Firm* — Lando & Anastasi, LLP

(57) ABSTRACT

A system is provided to align a movable cart to an assembly apparatus. The assembly apparatus has at least one item of a plurality of items for replacement within the assembly apparatus. The assembly apparatus includes a docking station. The movable cart is configured to receive a used item and/or provide a new item to the assembly apparatus. The movable cart includes an interface configured to dock within the docking station of the assembly apparatus. The system includes a sensor associated with one of the assembly apparatus and the movable cart and a laser associated with the other of the assembly apparatus and the movable cart. The sensor and the laser are configured to align the movable cart with the assembly apparatus after an initial docking of the movable cart within the docking station of the assembly apparatus.

14 Claims, 16 Drawing Sheets

(56) References Cited

U.S. PATENT DOCUMENTS

| | | | | |
|---|---|---|---|---|
| 10,144,226 | B1* | 12/2018 | Tsai | B41C 1/05 |
| 11,001,460 | B2* | 5/2021 | Huber | B65B 59/04 |
| 2006/0290085 | A1* | 12/2006 | Preston | B62B 3/10 |
| | | | | 280/79.3 |
| 2009/0205569 | A1* | 8/2009 | Perault | H05K 13/0465 |
| | | | | 118/713 |
| 2009/0255426 | A1* | 10/2009 | Doyle | H05K 3/0008 |
| | | | | 29/428 |
| 2014/0241849 | A1* | 8/2014 | Herrmann | B65H 31/3063 |
| | | | | 414/812 |
| 2018/0009247 | A1 | 1/2018 | Atwood et al. | |
| 2023/0202098 | A1* | 6/2023 | Gilan | B29C 64/268 |
| | | | | 264/497 |
| 2024/0034048 | A1* | 2/2024 | Lynch | B41F 15/40 |
| 2024/0336055 | A1* | 10/2024 | Cheng | B41F 15/44 |

* cited by examiner

SYSTEM AND METHOD FOR ALIGNING A MOVABLE CART TO AN ASSEMBLY APPARATUS

CROSS-REFERENCE TO RELATED APPLICATION

This application claims the benefit under 35 U.S.C. § 119(e) of U.S. Provisional Patent Application No. 63/138,856 titled SYSTEM AND METHOD FOR ALIGNING A MOVABLE CART TO AN ASSEMBLY APPARATUS filed on Jan. 19, 2021, which is incorporated herein by reference in its entirety for all purposes.

BACKGROUND OF THE DISCLOSURE

1. Field of Invention

This application relates generally to stencil printers and related methods to print viscous materials, e.g., solder paste, on an electronic substrate, e.g., a printed circuit board (PCB), and more particularly to systems and methods for fully automating such stencil printers and methods.

2. Discussion of Related Art

In manufacturing a surface-mount printed circuit board, an apparatus, such as a stencil printer and/or a dispenser, can be used to deposit solder paste onto the circuit board. Typically, a circuit board having a pattern of pads or some other conductive surface onto which solder paste will be deposited is automatically fed into the apparatus.

In a stencil printer, one or more small holes or marks (known as "fiducials") on the circuit board are used to properly align the circuit board with the stencil or screen of the stencil printer prior to printing solder paste onto the circuit board. In some systems, an optical alignment system embodying a vision system is used to align the circuit board with the stencil. Once the circuit board has been properly aligned with the stencil in the printer, the circuit board is raised to the stencil, solder paste is dispensed onto the stencil, and a wiper blade (or squeegee) traverses the stencil to force the solder paste through apertures in the stencil and onto the circuit board. The stencil is then separated from the circuit board and the adhesion between the circuit board and the solder paste causes most of the material to stay on the circuit board.

In a dispenser, very small amounts, or dots, of viscous material are deposited onto a circuit board. The viscous material may include liquid epoxy or solder paste, or some other related material. Prior to performing a dispensing operation, the circuit board is aligned or otherwise registered with a dispenser of the dispensing system. In one known method, this may be achieved by employing a vision system of the dispensing system to verify the location of landmarks, otherwise known as fiducials, or by locating known components on the circuit board. Once positioned, a dispensing head of the dispenser dispenses material on the circuit board.

Present day stencil printers and dispensers require manual intervention to perform routine operations. For example, during a changeover, an operator must perform many manual tasks, such as changing a stencil for the stencil printer, replacing solder paste cartridges for both stencil printers and dispensers, and replacing or replenishing other items. Each of these tasks require the operator to manually perform the task.

SUMMARY OF THE DISCLOSURE

One aspect of the present disclosure is directed to a system for aligning a movable cart to an assembly apparatus. In one embodiment, the assembly apparatus has at least one item of a plurality of items for replacement within the assembly apparatus. The assembly apparatus includes a docking station. The movable cart is configured to receive a used item and/or provide a new item to the assembly apparatus. The movable cart includes an interface configured to dock within the docking station of the assembly apparatus. In one embodiment, the system includes a sensor associated with one of the assembly apparatus and the movable cart and a laser associated with the other of the assembly apparatus and the movable cart. The sensor and the laser are configured to align the movable cart with the assembly apparatus after an initial docking of the movable cart within the docking station of the assembly apparatus.

Embodiments of the system further may include mounting the sensor on a support of the assembly apparatus and the laser is mounted on a frame of the movable cart. The assembly apparatus may include at least one sensor mounted on the support of the assembly apparatus. The sensors may be mounted on a stencil support configured to support a stencil within a stencil printer. The sensors may be mounted on a support configured to hold a substrate within a stencil printer. A position of the laser on the frame of the movable cart may be at an elevation that is the same elevation of the sensor of the assembly apparatus. The laser may be a low power laser. The sensor may be configured to produce an output signal that can be connected to a subsystem of the assembly apparatus. The subsystem may be a controller, and the sensor may be configured to produce an output signal that is processed by the controller. The controller may include software that is configured to convert the output signal into x-axis, y-axis and z-axis relative or absolute coordinates.

Another aspect of the present disclosure is directed to a method of aligning a movable cart to an assembly apparatus. The assembly apparatus has at least one item of a plurality of items for replacement within the assembly apparatus. The assembly apparatus includes a docking station. The movable cart is configured to receive a used item and/or provide a new item to the assembly apparatus. The movable cart includes an interface configured to dock within the docking station of the assembly apparatus. In one embodiment, the method comprises: providing a sensor on one of the assembly apparatus and the movable cart; and directing a laser toward the sensor, the laser being associated with the other of the assembly apparatus and the movable cart. The sensor and the laser are configured to align the movable cart with the assembly apparatus after an initial docking of the movable cart within the docking station of the assembly apparatus.

Embodiments of the method further may include configuring the sensor to produce an output signal that can be connected to a subsystem of the assembly apparatus. The subsystem may be a controller, and the sensor may be configured to produce an output signal that is processed by the controller. The controller may include software that is configured to convert the output signal into x-axis, y-axis and z-axis relative or absolute coordinates. The method further may include calibrating the laser. The laser may be calibrated to one side of the movable cart to a target that will ensure that the laser emits a beam that is aligned to the x-axis, y-axis and z-axis coordinate of the movable cart. The sensor may be mounted on the assembly apparatus in a way that the beam of light emitted from the laser on the movable cart will be a nominal position that the assembly apparatus will interpret as the 0,0 position for x-axis alignment and z-axis height when all axes in the assembly apparatus are in their initialized position. The information may inform the assembly apparatus that the movable cart is in a correct or proper position with respect to the assembly apparatus and that it is acceptable to perform a function. If a reading other than 0,0 is detected, this may be interpreted as a misalignment and the assembly apparatus or the movable cart can make the necessary adjustments to get back to a 0,0 reading to signal proper alignment of the movable cart and the assembly apparatus when the movable cart is docked. If there are readings other than 0,0 at initialization, this may be interpreted as an offset from a home position, which can be compensated for by the controller software of the assembly apparatus or by the controller of the movable cart, or both.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE DISCLOSURE

Figure 1:
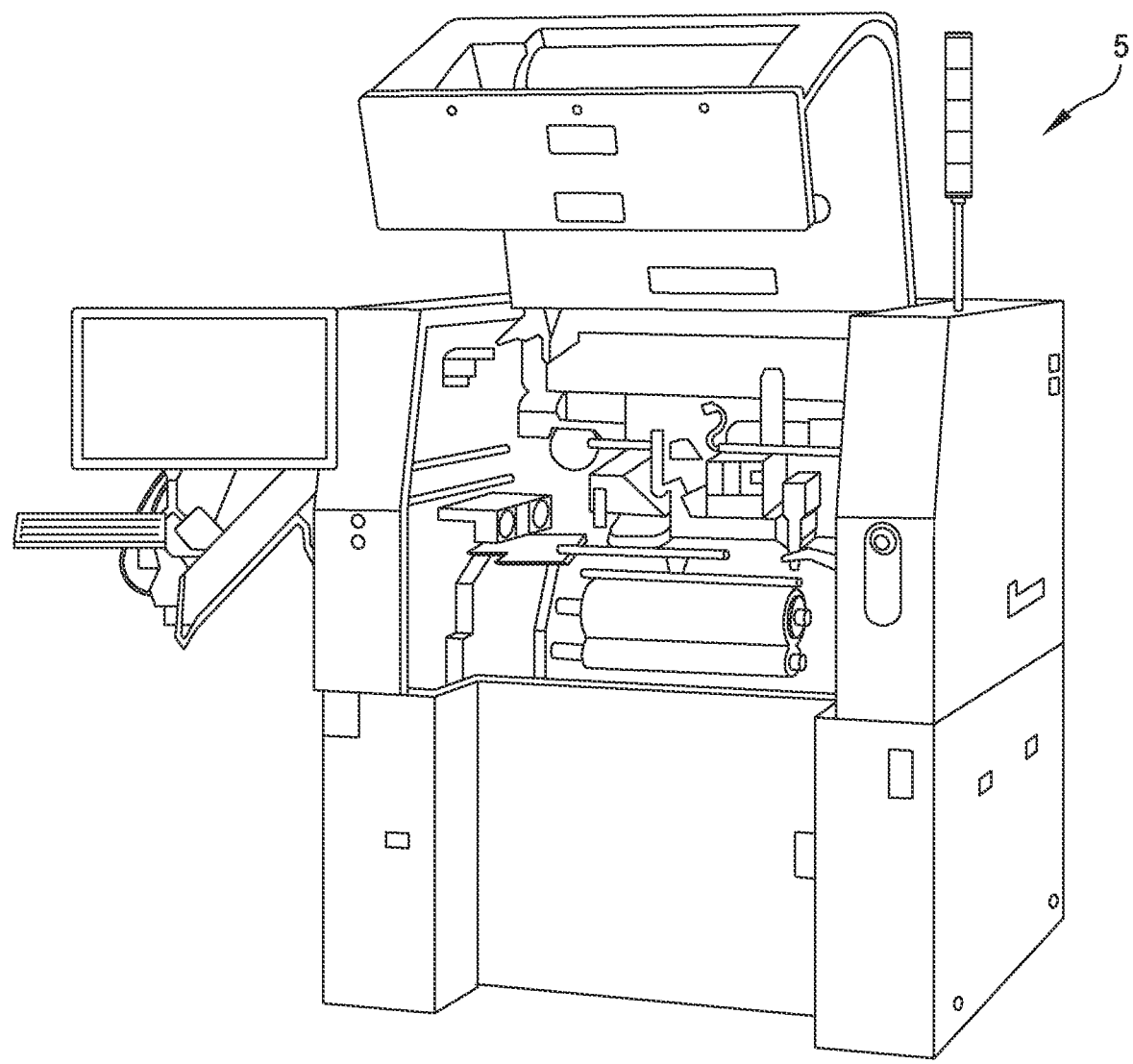
FIG. 1 is a front view of an assembly apparatus of one embodiment used to deposit assembly material on an electronic substrate.

The present disclosure relates generally to material application machines (referred to herein as "stencil printers," "screen printers," "printing machines," or "printers") and other equipment utilized in a surface mount technology (SMT) process lines and configured to apply an assembly material (e.g., solder paste, conductive ink, or encapsulation material) onto a substrate (e.g., a printed circuit board, referred to herein as an "electronic substrate," a "circuit board," a "board," a "PCB," a "PCB substrate," a "substrate," or a "PCB board") or to perform other operations, such as inspection, rework, or placement of electronic components onto a substrate. Specifically, embodiments of the present disclosure are described below with reference to stencil printers used to produce printed circuit boards.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The principles set forth in this disclosure are capable of other embodiments and of being practiced or carried out in various ways. Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls.

For purposes of illustration, embodiments of the present disclosure will now be described with reference to a stencil printer used to print an assembly material, such as solder paste, and to a dispenser used to deposit assembly material onto a circuit board. One skilled in the art will appreciate, however, that embodiments of the present disclosure are not limited to stencil printers and dispensers that print and deposit solder paste onto circuit boards, but rather, may be used in other applications requiring dispensing of other viscous assembly materials, such as glues and encapsulents. For example, the apparatus may be used to print or deposit epoxy for use as underfill for chip-scale packages. Further, stencil printers and dispensers in accordance with embodiments of the present disclosure are not limited to those that print and deposit assembly materials on circuit boards, but rather, include those used for printing other materials on a variety of substrates, such as semiconductor wafers. In certain embodiments, the stencil printer may include a Momentum® or an Edison™ series stencil printer platform offered by ITW Electronic Assembly Equipment of Hopkinton, Massachusetts. An exemplary stencil printer is generally designated at 5 in FIG. 1. In this embodiment, the stencil printer 5 is an Edison™ series stencil printer platform offered by ITW Electronic Assembly Equipment of Hopkinton, Massachusetts. Further, in certain embodiments, the dispensers may include a Prodigy™ series dispenser offered by ITW Electronic Assembly Equipment of Hopkinton, Massachusetts. An exemplary dispenser is generally designated at 7 in FIG. 2. In this embodiment, the dispenser 7 is a Prodigy™ dispenser platform offered by ITW Electronic Assembly Equipment of Hopkinton, Massachusetts.

Figure 3:
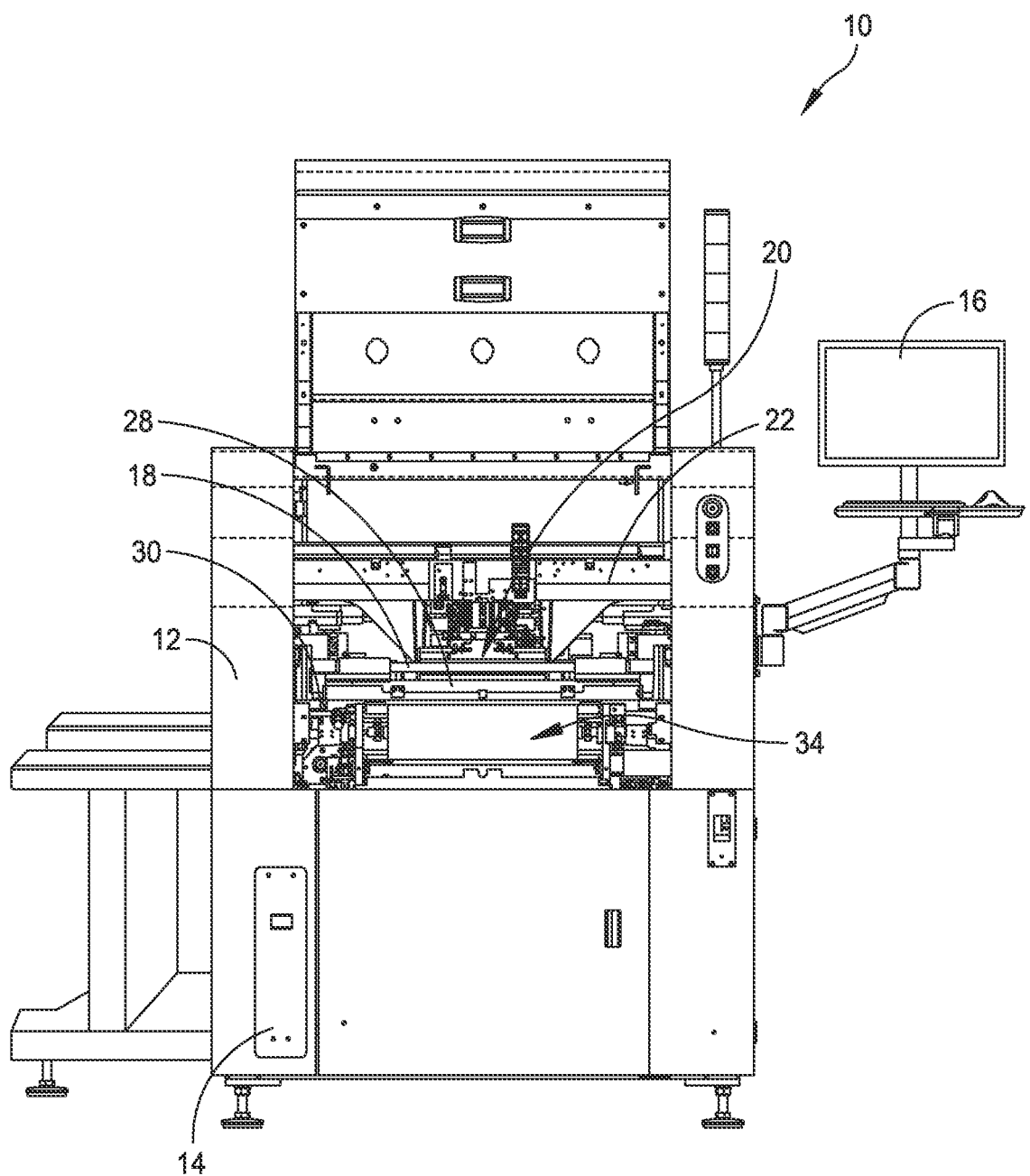
FIG. 3 is a front perspective view of the assembly apparatus illustrated in FIG. 1.

Referring to FIG. 3, there is generally indicated at 10 a stencil printer of an embodiment of the disclosure. As shown, the stencil printer 10 includes a frame 12 that supports components of the stencil printer. The components of the stencil printer may include, in part, a controller 14, a display 16, a stencil 18, and a print head or print head assembly, generally indicated at 20, which is configured to apply the solder paste in a manner described in greater detail below. In one embodiment, the controller 14 is positioned behind a panel of the stencil printer in the traditional manner.

Figure 2:
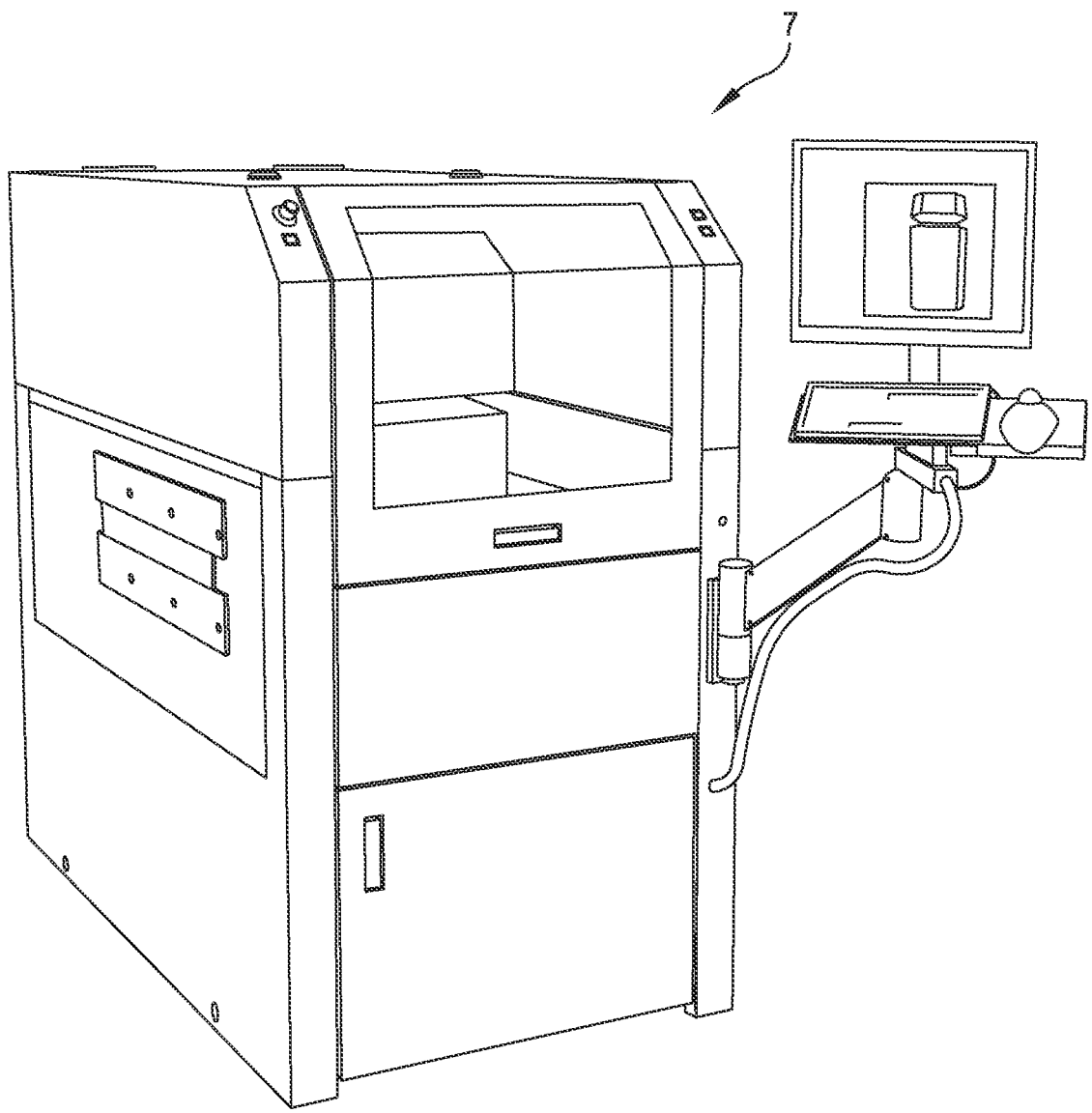
FIG. 2 is a front view of an assembly apparatus of another embodiment used to deposit assembly material on an electronic substrate.

As shown in FIG. 2 and described below, the stencil and the print head assembly may be suitably coupled or otherwise connected to the frame 12. In one embodiment, the print head assembly 20 may be mounted on a print head assembly gantry 22, which may be mounted on the frame 12. The print head assembly gantry 22 enables the print head assembly 20 to be moved in the y-axis direction under the control of the controller 14 and to apply pressure on the print head assembly as it engages the stencil 18. In a certain embodiment, the print head assembly 20 may be placed over the stencil 18 and may be lowered in the z-axis direction into contact and sealingly engage the stencil.

The stencil printer 10 may also include a conveyor system having rails (not shown) for transporting a printed circuit board (sometimes referred to as a "printed wiring board," "substrate," or "electronic substrate" herein) to a print position in the stencil printer. The rails sometimes may be referred to herein as a "tractor feed mechanism," which is configured to feed, load or otherwise deliver circuit boards to the working area of the stencil printer, which may be referred to herein as a "print nest," and to unload circuit boards from the print nest.

Figure 4:
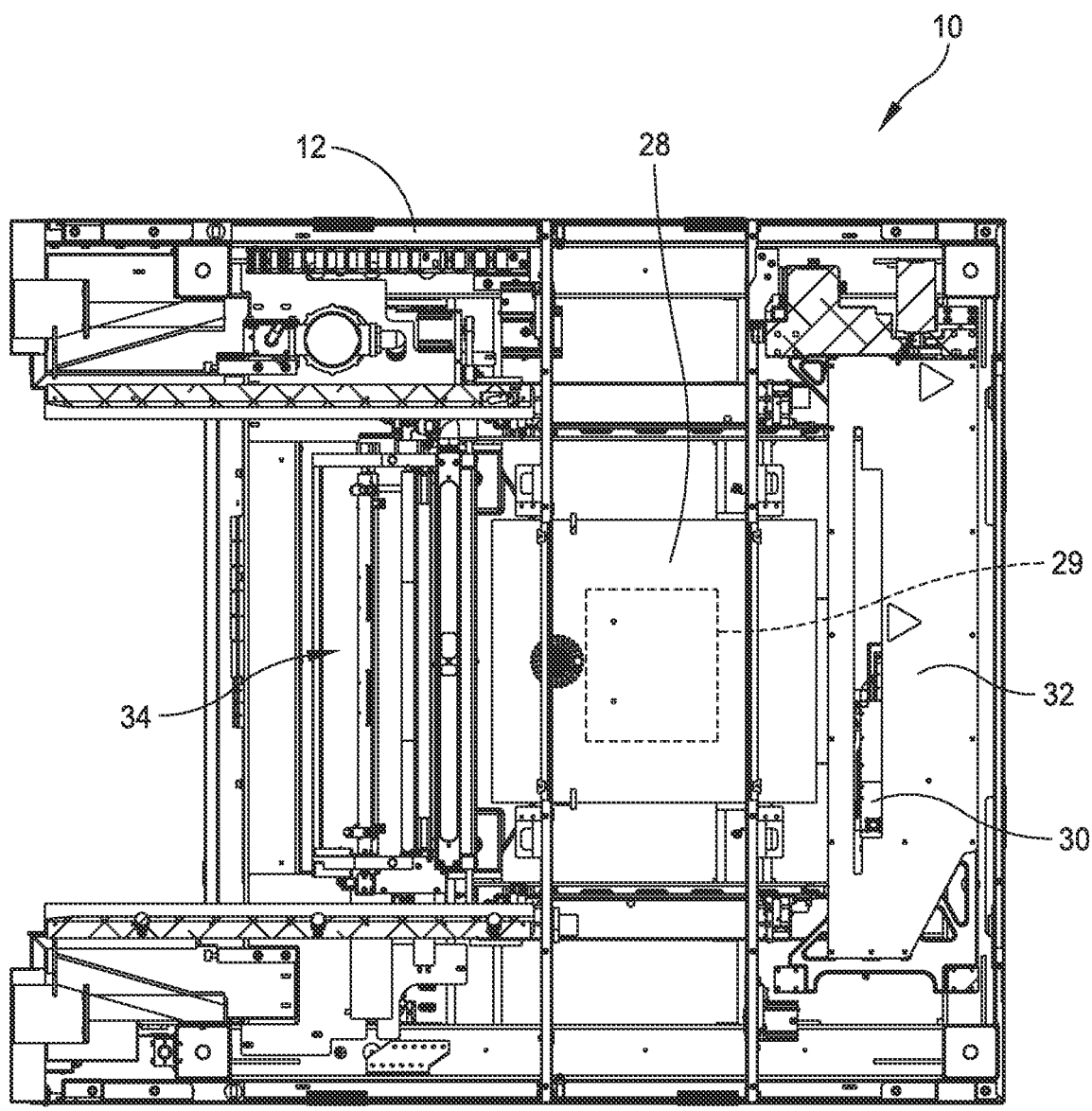
FIG. 4 is a top plan view of the assembly apparatus illustrated in FIG. 3 with portions removed.

Referring additionally to FIG. 4, the stencil printer 10 has a support assembly 28 to support the circuit board 29 (shown in dashed lines), which raises and secures the circuit board so that it is stable during a print operation. In certain embodiments, the substrate support assembly 28 further may include a particular substrate support system, e.g., a solid support, a plurality of pins or flexible tooling, which is positioned beneath the circuit board when the circuit board is in the print position. The substrate support system may be used, in part, to support the interior regions of the circuit board to prevent flexing or warping of the circuit board during the print operation.

In one embodiment, the print head assembly 20 may be configured to receive solder paste from a source, such as a dispenser, e.g., a solder paste cartridge, that provides solder paste to the print head assembly during the print operation. Other methods of supplying solder paste may be employed in place of the cartridge. For example, solder paste may be manually deposited between the blades or from an external source. Additionally, in a certain embodiment, the controller 14 may be configured to use a personal computer having a suitable operating system, such as a Microsoft Windows® operating system provided by Microsoft Corporation, with application specific software to control the operation of the stencil printer 10. The controller 14 may be networked with a master controller that is used to control a production line for fabricating circuit boards.

In one configuration, the stencil printer 10 operates as follows. A circuit board 29 is loaded into the stencil printer 10 using the conveyor rails. The support assembly 28 raises and secures the circuit board 29 to a print position. The print head assembly 20 is then lowered in the z-axis direction until blades of the print head assembly contact the stencil 18 at a desired pressure. The print head assembly 20 is then moved in the y-axis direction across the stencil 18 by the print head assembly gantry 22. The print head assembly 20 deposits solder paste through apertures in the stencil 18 and onto the circuit board 29. Once the print head assembly has fully traversed the stencil 18 across the apertures, the print head assembly is lifted off the stencil and the circuit board 29 is lowered back onto the conveyor rails. The circuit board 29 is released and transported from the stencil printer 10 so that a second circuit board may be loaded into the stencil printer. To print on the second circuit board 29, the print head assembly is lowered in the z-axis direction into contact with the stencil and moved across the stencil 18 in the direction opposite to that used for the first circuit board.

An imaging system 30 may be provided for the purposes of aligning the stencil 18 with the circuit board 29 prior to printing and to inspect the circuit board after printing. In one embodiment, the imaging system 30 may be disposed between the stencil 18 and the support assembly 28 upon which a circuit board is supported. The imaging system 30 is coupled to an imaging gantry 32 to move the imaging system. In one embodiment, the imaging gantry 32 may be coupled to the frame 12, and includes a beam that extends between side rails of the frame 12 to provide back and forth movement of the imaging system 30 over the circuit board 29 in a y-axis direction. The imaging gantry 32 further may include a carriage device, which houses the imaging system 30, and is configured to move along the length of the beam in an x-axis direction. The construction of the imaging gantry 32 used to move the imaging system 30 is well known in the art of solder paste printing. The arrangement is such that the imaging system 30 may be located at any position below the stencil 18 and above the circuit board 29 to capture an image of predefined areas of the circuit board or the stencil, respectively.

After one or more applications of the solder paste to circuit boards, excess solder paste may accumulate at the bottom of the stencil 18 and a stencil wiper assembly, generally indicated at 34, and may move beneath the stencil to remove the excess solder paste. In other embodiments, the stencil 18 may be moved over the stencil wiper assembly.

Figure 5:
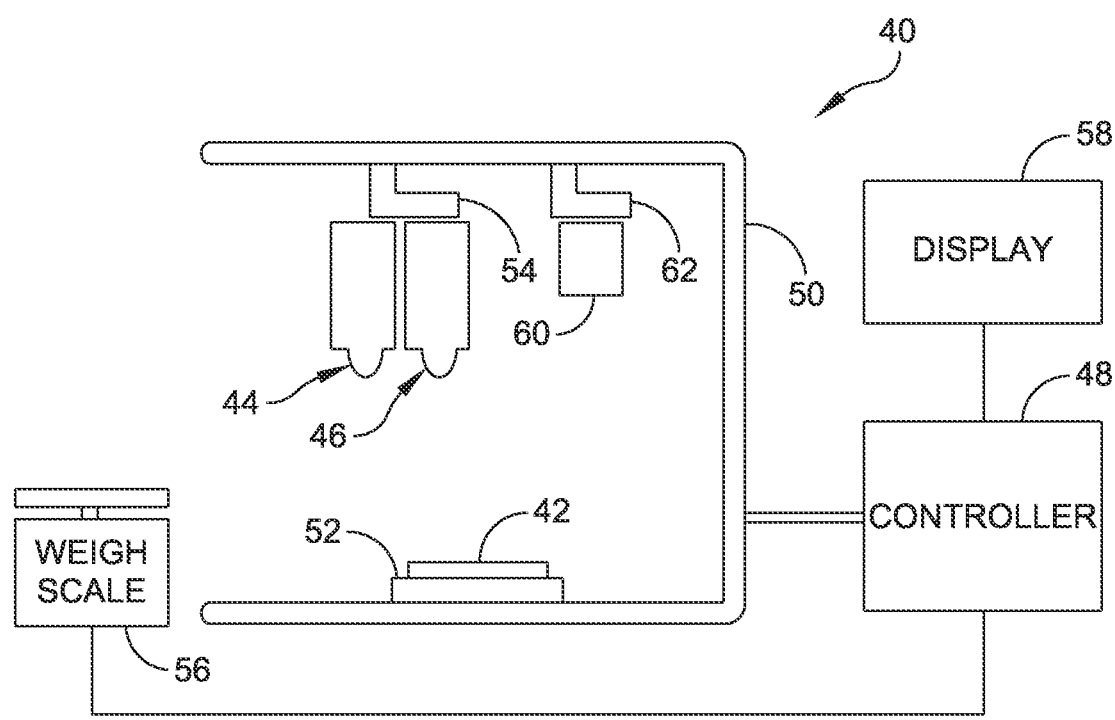
FIG. 5 is a schematic view of the assembly apparatus illustrated in FIG. 2.

Referring to FIG. 5, a dispensing system is generally indicated at 40, according to one embodiment of the present disclosure. The dispensing system 40 is used to dispense a viscous material (e.g., an adhesive, encapsulent, epoxy, solder paste, underfill material, etc.) or a semi-viscous material (e.g., soldering flux, etc.) onto an electronic substrate 42, such as a printed circuit board or semiconductor wafer. The dispensing system 40 may alternatively be used in other applications, such as for applying automotive gasketing material or in certain medical applications or for applying conductive inks. It should be understood that references to viscous or semi-viscous materials, as used herein, are exemplary and intended to be non-limiting. In one embodiment, the dispensing system 40 includes first and second dispensing units, generally indicated at 44 and 46, respectively, and a controller 48 to control the operation of the dispensing system. It should be understood that dispensing units 44, 46 also may be referred to herein as dispensing pumps and/or dispensing heads. Although two dispensing units 44, 46 are shown, it should be understood that a single dispensing unit or multiple dispensing units (more than two) can be employed.

The dispensing system 40 may also include a frame 50 having a base or support 52 for supporting the electronic substrate 42, a dispensing unit gantry 54 movably coupled to the frame for supporting and moving the dispensing units 44, 46, and a weight measurement device or weigh scale 56 for weighing dispensed quantities of the viscous material, for example, as part of a calibration procedure, and providing weight data to the controller 48. A conveyor system (not shown) or other transfer mechanism, such as a walking beam, may be used in the dispensing system 40 to control loading and unloading of electronic substrates 42 to and from the dispensing system. The gantry 54 can be moved using motors under the control of the controller 48 to position the dispensing units 44, 46 at predetermined locations over the electronic substrate 42. The dispensing system 40 may include a display unit 58 connected to the controller 48 for displaying various information to an operator. There may be an optional second controller for controlling the dispensing units 44, 46. Also, each dispensing unit 44, 46 can be configured with a z-axis sensor to detect a height at which the dispensing unit is disposed above the electronic substrate 42 or above a feature mounted on the electronic substrate. The z-axis sensor is coupled to the controller 48 to relay information obtained by the sensor to the controller.

Prior to performing a dispensing operation, as described above, the electronic substrate 42, e.g., the printed circuit board, must be aligned or otherwise in registration with the dispensing units 44, 46 of the dispensing system. The dispensing system 40 further includes a vision system 60, which, in one embodiment, is coupled to a vision system gantry 62 movably coupled to the frame 50 for supporting and moving the vision system. In another embodiment, the vision system 60 may be provided on the dispensing unit gantry 54. As described, the vision system 60 is employed to verify the location of landmarks, known as fiducials, or components on the electronic substrate 42. Once located, the controller 48 can be programmed to manipulate the movement of one or more of the dispensing units 44, 46 to dispense material on the electronic substrate 42.

Systems and methods of the present disclosure are directed to dispensing material onto an electronic substrate, e.g., a printed circuit board. The description of the systems and methods provided herein reference exemplary electronic substrates (e.g., printed circuit boards), which are supported on the support 52 of the dispensing system 40. In one embodiment, the dispense operation is controlled by the controller 48, which may include a computer system configured to control material dispensing units 44, 46. In another embodiment, the controller 48 may be manipulated by an operator. The controller 48 is configured to manipulate the movement of the vision system gantry 62 to move the vision system 60 so as to obtain one or more images of the electronic substrate 42. The controller 48 further is configured to manipulate the movement of the dispensing unit gantry 54 to move the dispensing units 44, 46 to perform dispensing operations.

Figure 6:
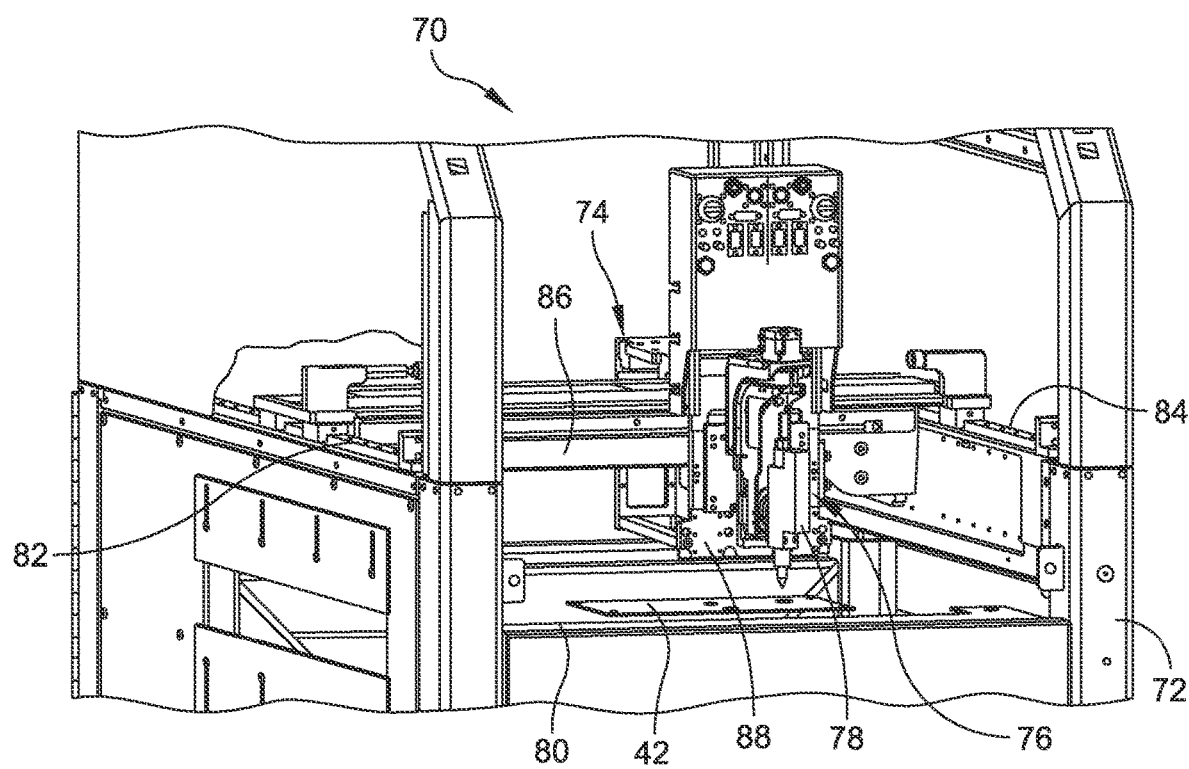
FIG. 6 is a front perspective view of a portion of the assembly apparatus illustrated in FIG. 2.
Figure 7:
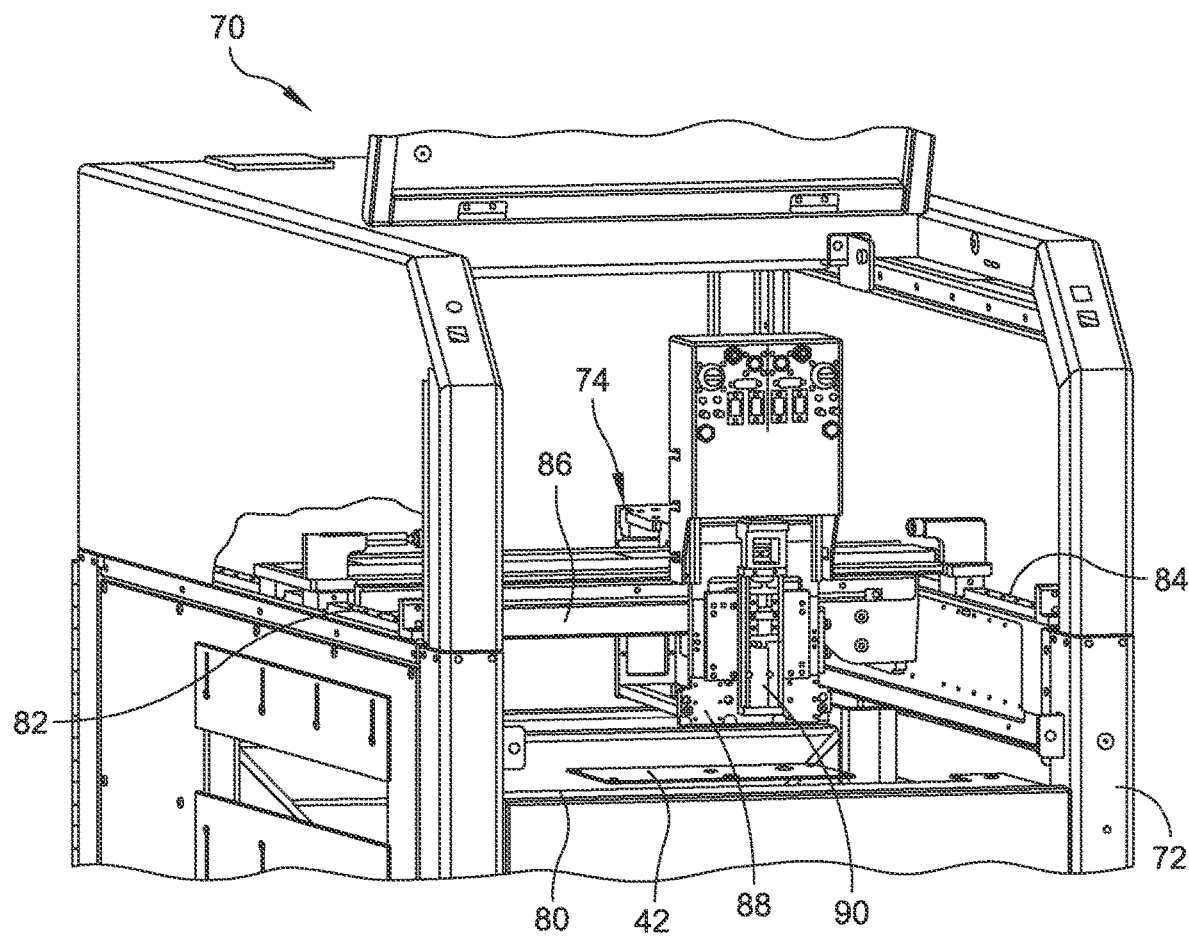
FIG. 7 is a front perspective view of the assembly apparatus illustrated in FIG. 6 with portions removed to view a gantry of the assembly apparatus.

Referring to FIGS. 6 and 7, a dispensing system is generally indicated at 70. As shown, the dispensing system 70 includes a frame 72 configured to support the major sub-assemblies of the dispensing system. The dispensing system 70 further includes a gantry system, generally indicated at 74, which is configured to move in x-axis and y-axis directions. The dispensing system 70 further includes a dispensing unit assembly, generally indicated at 76, which is supported by the gantry system 74. FIG. 6 illustrates the dispensing system 70 having the dispensing unit assembly 76 and FIG. 7 illustrates the dispensing system with the dispensing unit assembly removed. As shown, the dispensing unit assembly includes a dispensing unit 78, which as described below, is configured to deposit material on the substrate, e.g., substrate 42. A conveyor system (not shown) may be used in the dispensing system 70 to control loading and unloading of substrates, e.g., electronic substrate, to and from a support 80 of the dispensing system. The gantry system 74 can be moved using motors under the control of a controller, in a manner similar to controller 48 of dispensing system 40, in the x-axis and y-axis directions to position the dispensing unit assembly 76 at predetermined locations over the electronic substrate provided on the support 80.

In one embodiment, as shown in FIGS. 6 and 7, the gantry system 74 may be configured to include a left-hand side rail 82, a right-hand side rail 84, and a beam 86 that extends between the two side rails. The beam 86 is configured to move in a y-axis direction along the side rails 82, 84 to achieve y-axis movement of the dispensing unit assembly 76. The gantry system 74 further includes a carriage 88 that is coupled to the beam 86 and configured to move along a length of the beam to provide x-axis movement of the dispensing unit assembly 76. Specifically, the carriage 88 supports the dispensing unit 78 of the dispensing unit assembly 76, and is configured to move along the length of the beam 86 in the x-axis direction to move the dispensing unit over desired locations of the electronic substrate positioned on the support 80 of the dispensing system 70. In a certain embodiment, movement of the gantry system 74 (i.e., movement of the beam 86 and the carriage 88) in the x-y plane may be achieved by employing ball screw mechanisms driven by respective motors as is well known in the art.

The dispensing unit assembly 76 is configured to move the dispensing unit 78 in a z-axis direction by a z-axis drive mechanism 90, which is shown in FIG. 7. The amount of z-axis movement may be determined by measuring the distance between the tip of a needle (not shown) of the dispensing unit 78 and the electronic substrate. When moving, the dispensing unit 78 may be positioned at a nominal clearance height above the electronic substrate. The clearance height may be maintained at a relatively consistent elevation above the electronic substrate when moving from one dispense location to another dispense location. Upon reaching a predetermined dispense location, the z-axis drive mechanism 90 lowers the dispensing unit 78 to the electronic substrate so that dispensing of material on the electronic substrate may be achieved.

Still referring to FIGS. 6 and 7, the dispensing unit 78 is moved over the electronic substrate in such a manner to perform a dispense operation with the dispensing unit. However, prior to dispensing, the position of the electronic substrate with respect to the dispensing unit 78 is determined so that accurate dispensing may take place. Specifically, in one embodiment, the carriage 88 can be configured to include an optical element or camera that is designed to take an image of the electronic substrate. Although the camera is described to be mounted on the carriage 88, it should be understood that the camera may be separately mounted on the beam 86 or on an independent gantry. The camera may be referred to herein as a "vision system" or an "imaging system." To align the electronic substrate with the dispensing unit 78 of the dispensing unit assembly 76 and gantry system 74, images of at least two fiducials provided on the electronic substrate are taken by the camera. If the electronic substrate is out of position, the gantry system may be manipulated to account for the actual position of the electronic substrate. In one embodiment, the camera may be calibrated to determine a camera-to-needle offset distance for the dispensing unit.

In another embodiment, vision alignment and clearance height sensing can be achieved with a laser or another calibrated distance measurement device provided within the dispensing system 70.

Stencil printers and dispensers each require manual intervention to perform replacement of certain parts and/or replenishment operations. For example, in a stencil printer, a typical stencil requires replacement after a certain period of time, e.g., four hours. Also, stencils need replacement for separate production runs. In addition, with both stencil printers and dispensers, solder paste cartridges, which supply temperature-controlled solder paste to the stencil printer and the dispenser, require replacement over time, e.g., within four hours or less. A separate production run may require a different solder paste material. With stencil printers, squeegee blades and tooling are subject to wear during use and require periodic replacement.

Embodiments of the present disclosure are directed to a delivery system that is configured to automate a changeover process for a stencil printer and a dispenser, or any other type of assembly processing equipment, including but not limited to pick-and-place machines, wave and selective soldering machines, reflow ovens, cleaners and inspectors. In one embodiment, the delivery system includes a movable cart that is configured to engage a stencil printer and/or a dispenser to supply and receive replacement and replenishment parts and materials to the stencil printer and/or the dispenser to perform changeovers. For example, the stencil printer and the dispenser each may include a docking station that is configured to receive the movable cart. The docking station may include an interface that enables the movable cart to communicate with the stencil printer and/or the dispenser. A single movable cart may be configured to include changeover stencils, replacement stencils, replacement solder paste cartridges, replenishment solder paste cartridges, replacement squeegee blades, replenishment squeegee blades, and replacement support tooling. During a changeover, for example, the stencil printer and/or the dispenser each must be reconfigured to produce different items. Thus, for example, a different type of solder paste may be employed within the stencil printer and/or the dispenser to produce a different product.

The changeover process described herein can be achieved by a single movable cart that is configured to replace and/or replenish each item. In other embodiments, more than one movable cart can be provided. For example, the movable cart may be configured to support a predetermined number of paste cartridges, which are selected for production runs anticipated for a particular day or a particular period of time. The movable cart and/or the stencil printer or the dispenser can be configured to identify the paste cartridges, store the paste cartridges in a suitable environment, transport the paste cartridges to and from the stencil printer and the dispenser, inspect the paste cartridges, and interface with the stencil printer. The movable cart also may be configured to remove used parts, such as paste cartridges, from the stencil printer and the dispenser. Moreover, the movable cart can be configured to store paste cartridges long term. In one embodiment, long term storage of solder paste can be achieved by refrigeration at 0 to 10° C. (32 to 50° F.). The paste cartridges can be stored at a location in the movable cart to maintain this temperature range. In another embodiment, the movable cart can be configured to pre-heat the paste cartridges prior to use to ready the cartridges for use in the stencil printer.

Embodiments of the present disclosure are further directed to a delivery system that is configured to automate a replenishment process for a stencil printer. In one embodiment, the delivery system includes a movable cart that is configured to engage a stencil printer to supply and receive replacement and replenishment parts and materials to the stencil printer. For example, the stencil printer may include a docking station that is configured to receive the movable cart. The docking station may include an interface that enables the movable cart to communicate with the stencil printer. A single movable cart may be configured to include changeover stencils, replacement stencils, replacement solder paste cartridges, replenishment solder paste cartridges, replacement squeegee blades, replenishment squeegee blades, and replacement support tooling. During a replenishment, for example, critical consumable products of the stencil printer must be replenished periodically. In one example, the solder paste cartridge requires replacement when depleted. Other items further may be replenished, such as paper and solvent used in stencil wipers.

The replenishment process described herein can be achieved by a single movable cart that is configured to replenish all replenishable items. In other embodiments, more than one movable cart can be provided. For example, for solder paste replenishment, the movable cart is configured to support several replacement solder paste cartridges. The movable cart and/or the stencil printer can be configured to identify the replacement solder paste cartridge, store the cartridges, transport the cartridges to and from the stencil printer, inspect the cartridges, and interface with the stencil printer. The movable cart also may be configured to remove used items, such as spent cartridges, from the stencil printer.

Figure 8:
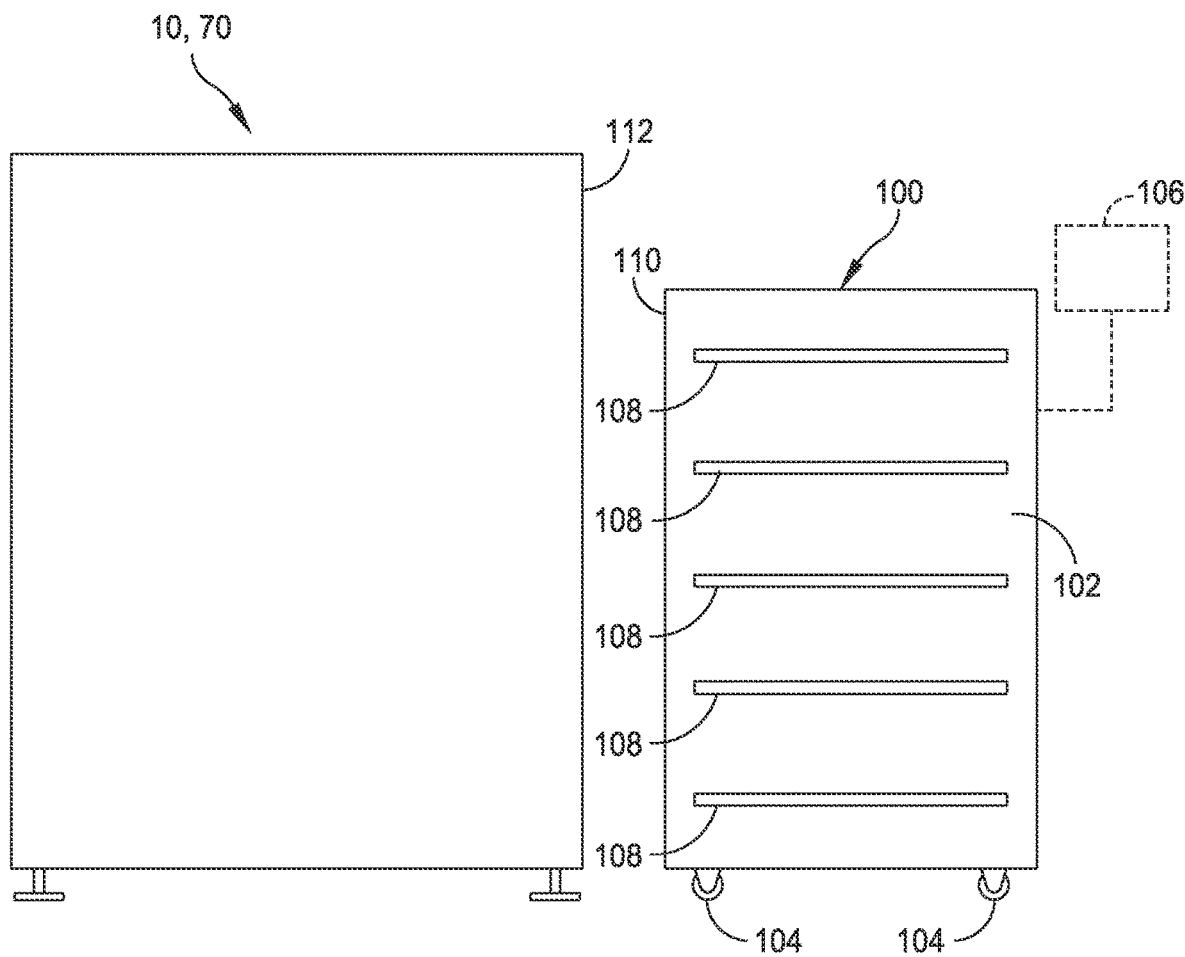
FIG. 8 is a schematic elevation view of an assembly apparatus and a movable cart of embodiments of the present disclosure.

Referring to FIG. 8, in one embodiment, a movable cart, generally indicated at 100, is shown in a docked position with respect to an assembly apparatus, e.g., stencil printer 10 or dispensing system 70. As shown, the movable cart 100 includes a frame or housing 102 configured to support replacement and/or replenishment items. As shown, the frame 102 of the movable cart 100 is generally rectangular and is supported on wheels or casters, each indicated at 104. In one embodiment, the movable cart 100 is configured to be manually moved by an operator by pushing the housing 102 of the movable cart. In this embodiment, the movable cart 100 can be configured with a push bar or a handle. In another embodiment, the movable cart 100 is configured to be automatically moved, either by remote control or by an automated control associated with the movable cart, the assembly apparatus 10, 70, the production line, and/or some other dedicated control. In this embodiment, the movable cart 100 can include wheels 104 that are driven by a suitable motor and drive train, and a control 106 associated with the movable cart. Or, in other embodiments, the control can be associated with the assembly apparatus 10, 70, the production line, and/or some other dedicated control configured to control the movable cart. The movable cart 100 further can include one or more sensors and/or a vision system, e.g., cameras, to guide the movable cart from a stockroom, for example, to the assembly apparatus 10, 70.

In one embodiment, the movable cart 100 includes one or more shelves, each indicated at 108, which are configured to store items for the assembly apparatus 10, 70. For example, the shelves 108 can be specifically designed to support new and spent/used paste cartridges. One or more shelves 108 can be configured to move vertically within the housing 102 to achieve a height suitable to operate with the assembly apparatus 10, 70. Some shelves 108 may be designated as "clean shelves" to support clean or new items ready to be used within the assembly apparatus 10, 70. Some shelves 108 may be designated as "dirty shelves" to support used items to be taken away from the assembly apparatus 10, 70. The shelves 108 can be spaced apart from one another specific distances to receive various items. For example, the shelves 108 can be spaced apart ⅜-inch to 1½-inch from one another to accommodate stencil frame thicknesses.

The movable cart 100 can be configured with an interface, which is designed to dock within a docking station provided on the assembly apparatus 10, 70. In one embodiment, illustrated in FIG. 8, the movable cart 100 includes an interface 110, which is configured to dock within a docking station 112 of the assembly apparatus 10, 70, both from a mechanic interface and an electronics communication interface. In a particular embodiment, the movable cart 100 can be configured with a unique mechanical interface that mates with a unique mechanical docking station of the assembly apparatus 10, 70. The unique mechanical interface/docking station can include geometric features. In another embodiment, the movable cart 100 can be configured with pins that are received within guides associated with the assembly apparatus 10, 70 to register the movable cart with the assembly apparatus prior to fully docking the movable cart. Other types of guides can be used, such as electrical/magnetic guides, vision guides, sensors, latches, etc. The movable cart 100, when docked within the docking station 112 of the assembly apparatus 10, 70, can physically engage the assembly apparatus or be spaced from the assembly apparatus.

Figure 9:
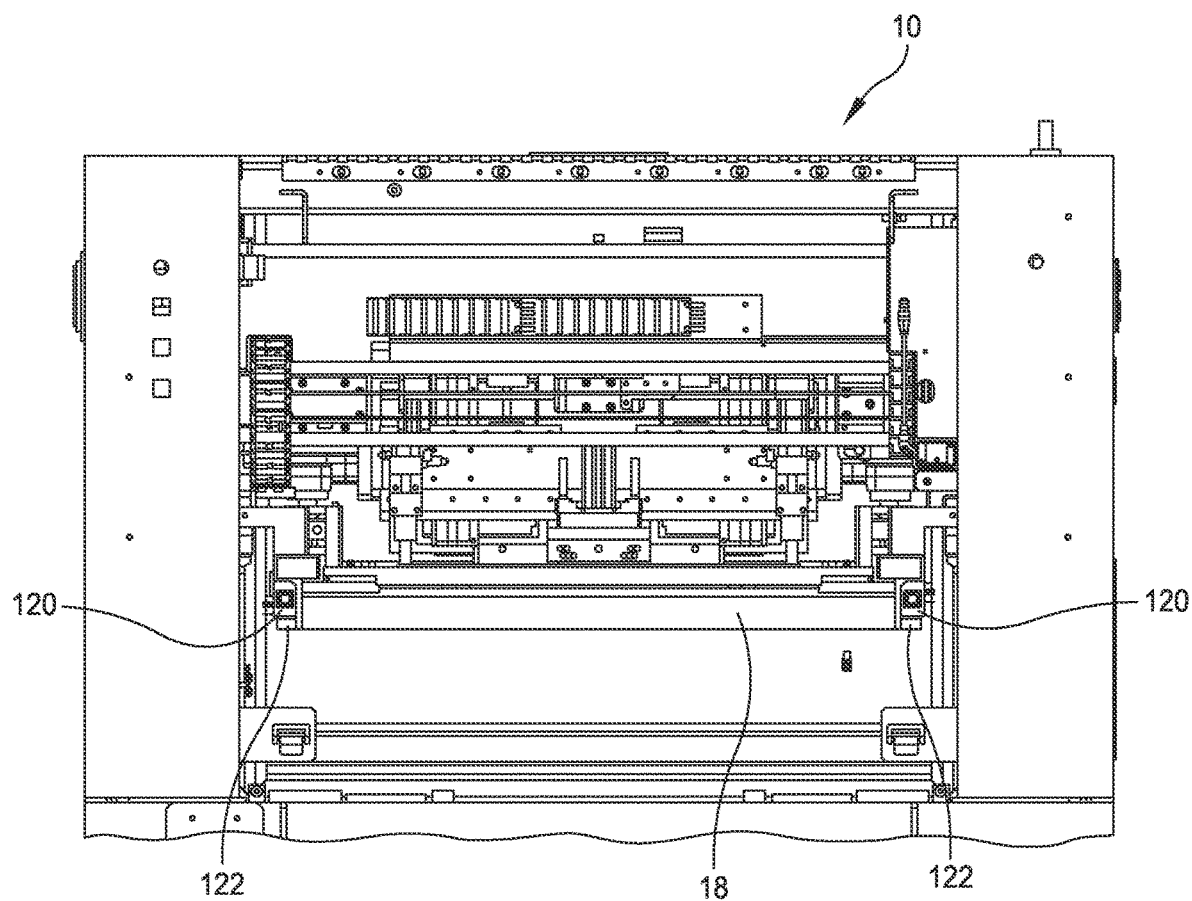
FIG. 9 is a front perspective view of an assembly apparatus having a system to align the movable cart to the assembly apparatus.
Figure 10:
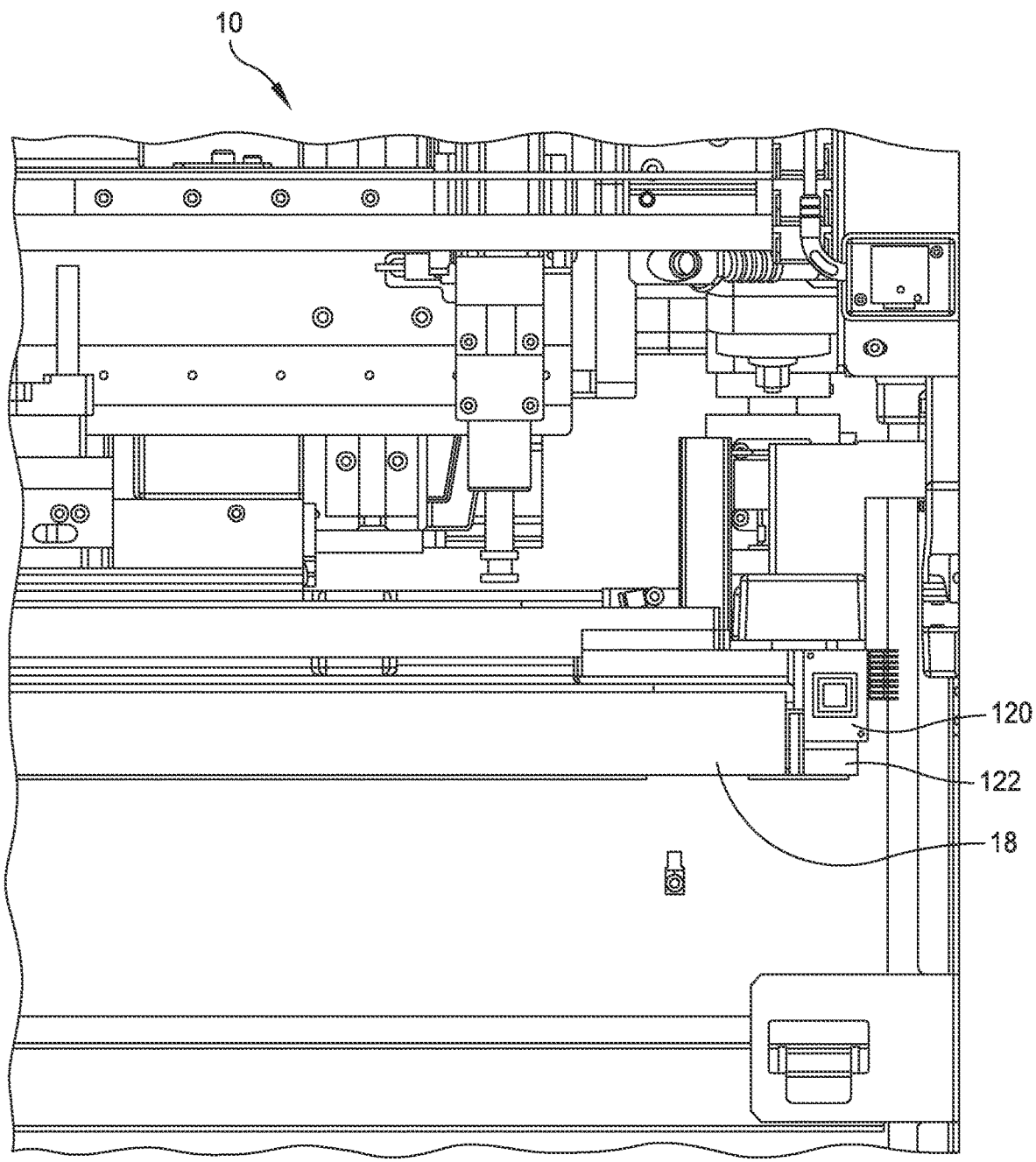
FIG. 10 is an enlarged front perspective view of a portion of the assembly apparatus illustrated in FIG. 9.
Figure 11:
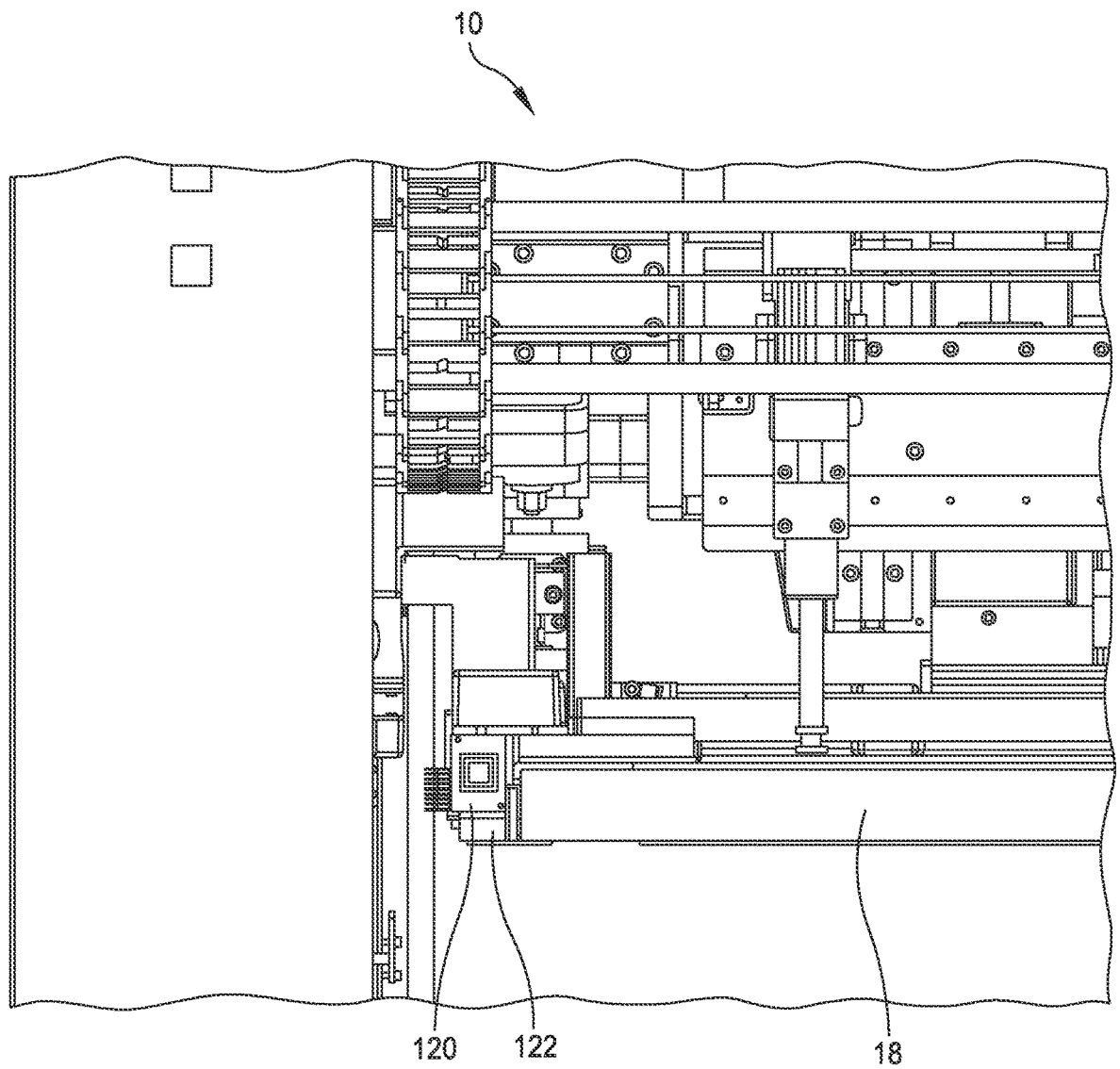
FIG. 11 is an enlarged front perspective view of another portion of the assembly apparatus illustrated in FIG. 9.

Embodiments of the present disclosure are directed to systems and methods that are used to align the movable cart with the assembly apparatus after an initial positioning of the movable cart within the docking station of the assembly apparatus. In one embodiment, referring to FIGS. 9-11, the assembly apparatus, e.g., stencil printer 10, includes one or more sensors configured to detect light generated from one or more lasers provided on the movable cart. As shown, in one embodiment, a system of aligning the movable cart with the assembly apparatus includes two sensors, each indicated at 120, suitably mounted on a support structure of the assembly apparatus 10. Although two sensors 120 are shown, the system can include only one sensor to align the movable cart with the assembly apparatus. In one embodiment, shown in FIGS. 9-11, the sensors 120 are mounted on a stencil support 122 configured to support a stencil, e.g., stencil 18. The provision of the sensors 120 on the stencil support 122 places the movable cart, once initially positioned in front of the assembly apparatus, in a correct position. Once alignment is confirmed, the movable cart can be moved to fully dock the movable cart within the assembly apparatus.

In a dispenser, one or two sensors, such as sensors 120, can be provided on a frame of the dispenser proximate to tooling supporting circuit boards for processing. In another embodiment, the sensors can be provided on a gantry supporting dispensing head(s) of the dispenser. As mentioned above, while two sensors 120 are shown, it should be understood that only one sensor is required to accurately align the movable cart with the assembly apparatus. In one embodiment, the sensor 120 is a position sensing diode.

Figure 12:
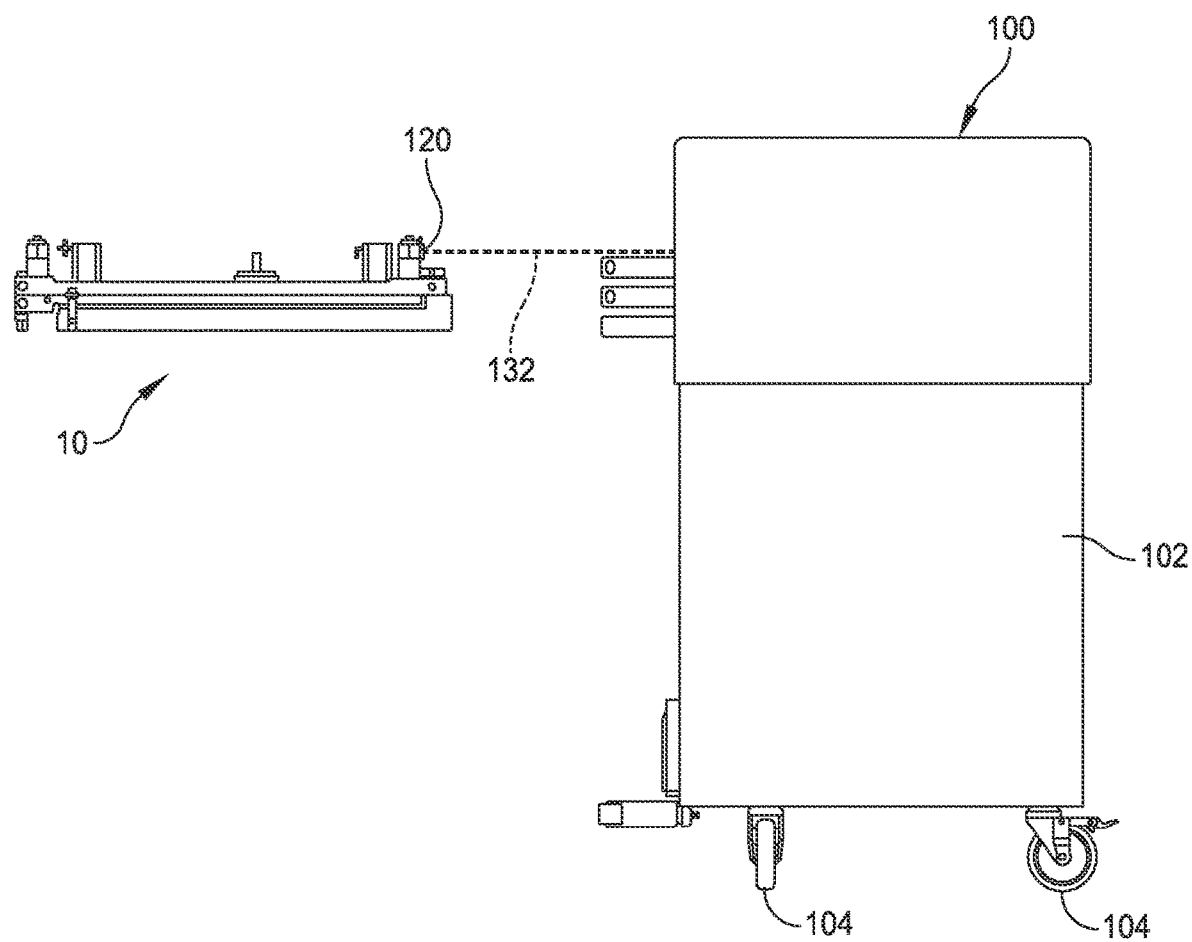
FIG. 12 is an elevation view of the assembly apparatus and the movable cart showing aspects of the system to align the movable cart to the assembly apparatus.
Figure 13:
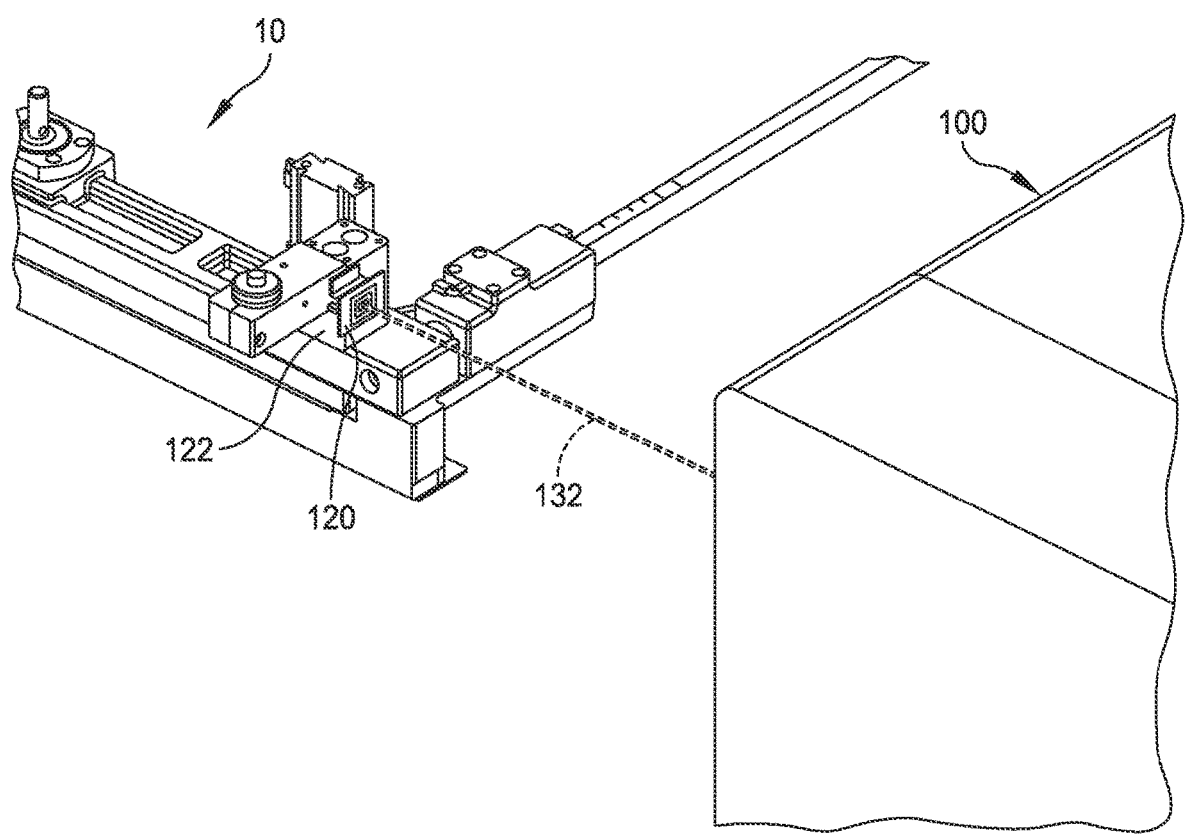
FIG. 13 is an enlarged perspective view of the system illustrating a sensor of the system.
Figure 14:
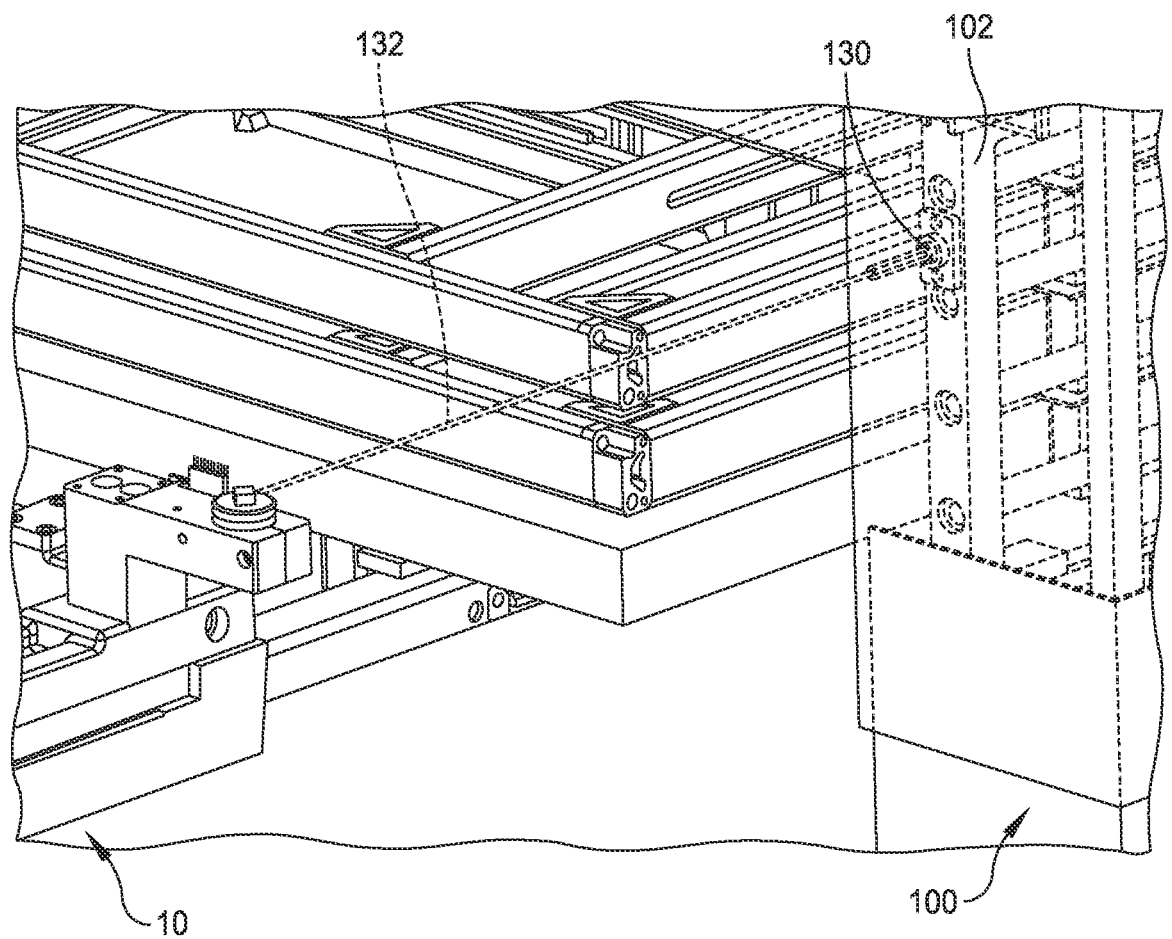
FIG. 14 is another enlarged perspective view of the system illustrating a laser of the system.

Referring to FIGS. 12-14, and particularly FIG. 14, the system further includes a laser 130, e.g., a low power laser, mounted on the frame of the movable cart. Although one laser 130 is shown in the drawings, the system can include two lasers, one for each sensor 120, to align the movable cart with the assembly apparatus. As shown, the laser 130 is configured to generate a beam of light 132 directed to the sensor 120 provided on the assembly apparatus 10. The position of the laser 130 on the frame 102 of the movable cart 100 is at an elevation that is the same elevation of the sensors 120 on the sensor support 122 of the assembly apparatus 10. The laser 130 can be provided on the frame 102 in any suitable position to align the movable cart 100 to the assembly apparatus 10.

Figure 15:
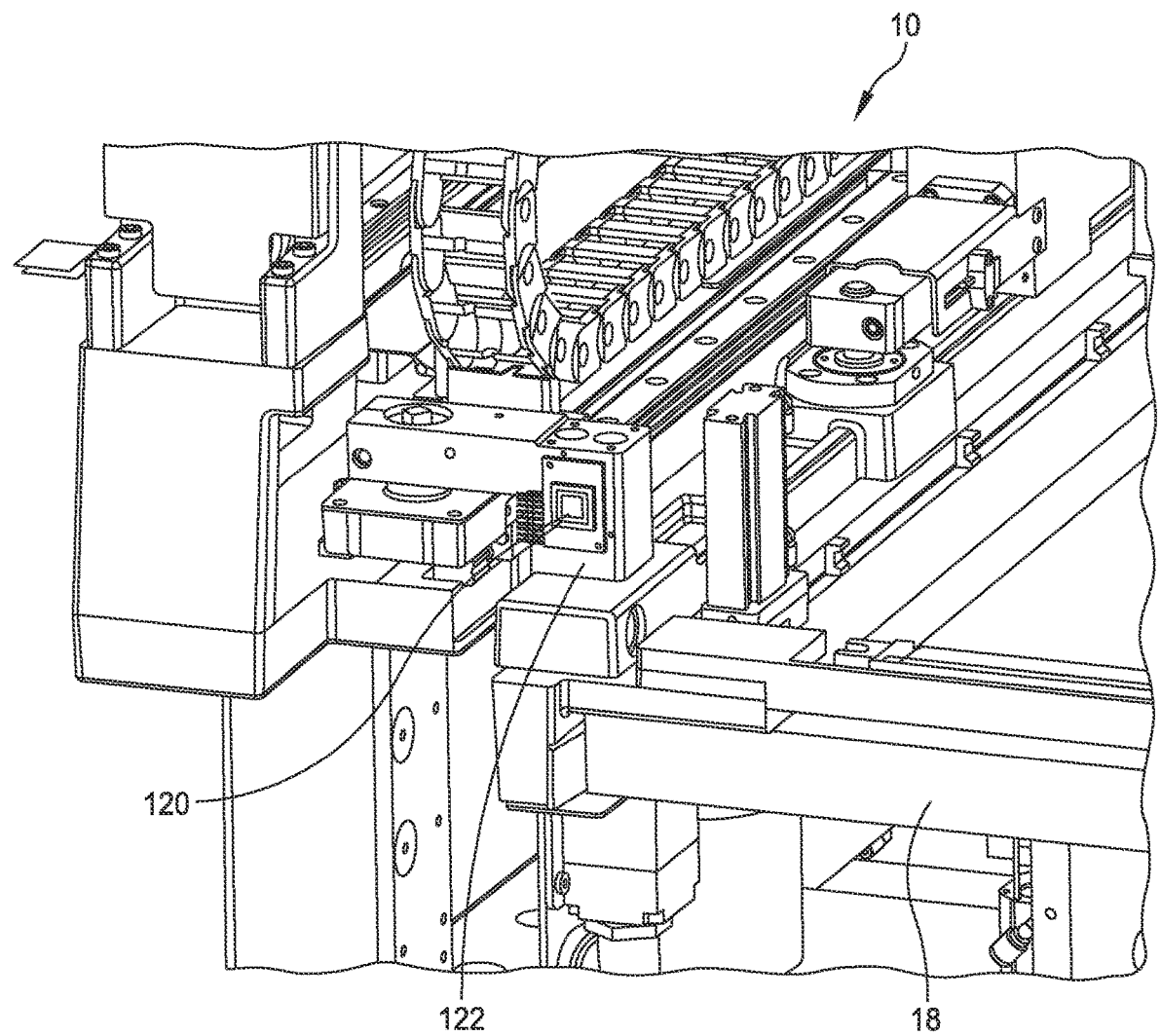
FIG. 15 is another enlarged perspective view of the system illustrating the mounting of the sensor on the assembly apparatus.
Figure 16:
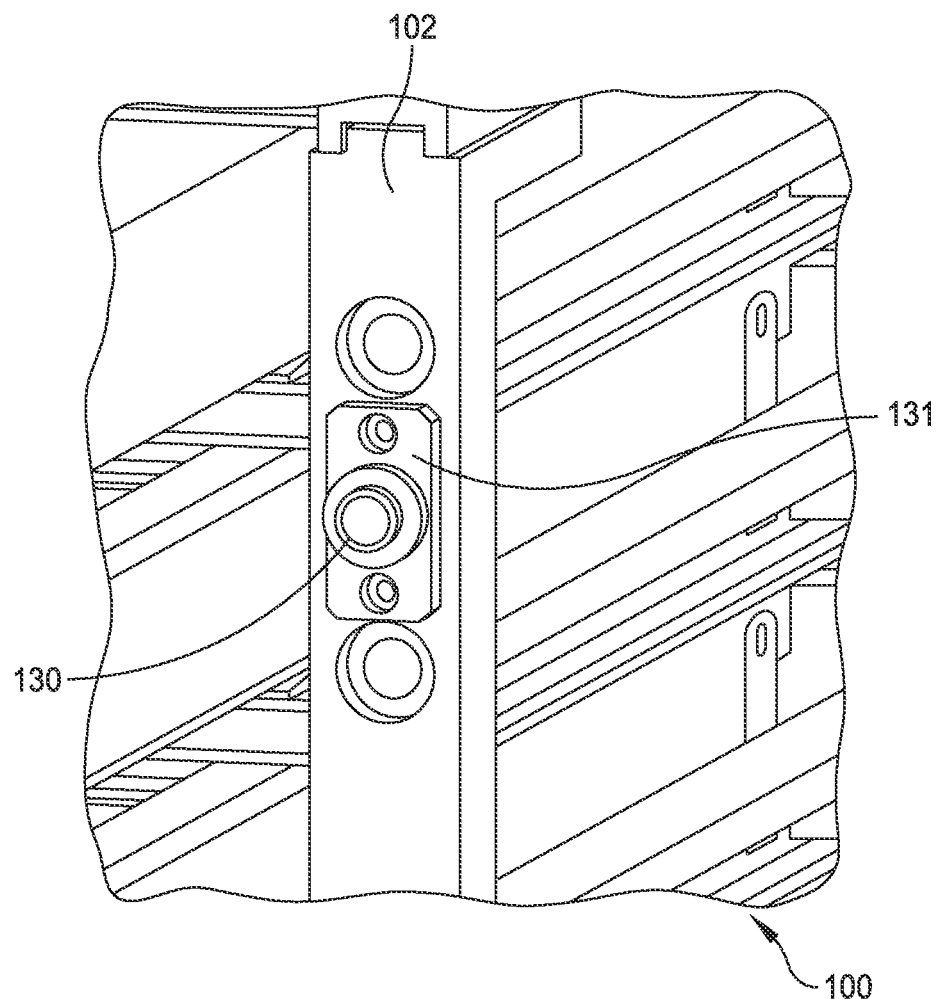
FIG. 16 is yet another enlarged perspective view of the system illustrating the mounting of the laser on the movable cart.

Referring to FIGS. 15 and 16, FIG. 15 illustrates the manner in which the sensor 120 is secured to the assembly apparatus 10. As shown, the sensor 120 includes a PCB substrate having mounting holes that are configured to receive standoffs, which are secured to the frame of the apparatus 10. FIG. 16 illustrates the manner in which the laser 130 is secured to the movable cart 100. As shown, the laser 130 is attached to the frame 102 of the movable cart 100 by an antistatic plastic housing 131, which is secured to the frame by suitable fasteners.

During operation, once the movable cart is initially positioned in front of the assembly apparatus, the laser 130 emits a beam of light 132 toward the assembly apparatus, with the beam of light being directed to and received by the sensor 120. Once aligned, the movable cart can be fully docked within the assembly apparatus.

In one embodiment, the sensor 120 is configured to produce an output signal that can be connected to a subsystem, e.g., the controller of the assembly apparatus and/or the controller 106 of the movable cart 100. For a stencil system, the sensor 120 can be coupled to the controller 14 of the stencil printer 10 and produce an output signal that is processed by the controller 14. For a dispenser, the sensor 120 can be coupled to the controller 48 of the dispensing system 40 and produce an output signal that is processed by the controller 48. The subsystem of the assembly apparatus, e.g., suitable software associated with the controller of the assembly apparatus, is configured to convert the output signal into x-axis, y-axis and z-axis relative or absolute coordinates. As mentioned above, the subsystem can be associated in addition to or alternatively to the movable cart 100.

Further, in one embodiment, the laser 130 is calibrated to one side of the movable cart 100, e.g., a shelf 108 of the movable cart, to a target that will ensure that the laser emits a beam of light 132 that is aligned to the x-axis, y-axis and z-axis coordinate of the movable cart. The calibration ensures the beam of light 132 is sufficiently aligned when installed, which is important to make sure the system operates with all types of assembly apparatus that utilize the sensor 120 and laser 130 to align the movable cart 100 to the assembly apparatus.

During operation, the sensor 120 is mounted on the assembly apparatus in a position so that the beam of light 132 emitted from the laser 130 on the movable cart will be a nominal position that the subsystem of the assembly apparatus will interpret as the 0,0 position for x-axis alignment and z-axis height, e.g., a height of the stencil for the assembly apparatus, when all axes in the assembly apparatus are in their initialized position. This information will inform the assembly apparatus that the movable cart is in a correct or proper position with respect to the assembly apparatus and that it is acceptable to perform a function, e.g., to transfer a stencil from the movable cart to the assembly apparatus. The y-axis in this case is used for light intensity measurements during calibration. If a reading other than 0,0 is detected, this is interpreted as a misalignment and the assembly apparatus or the movable cart can make the necessary adjustments to get back to a 0,0 reading to signal proper alignment of the movable cart and the assembly apparatus when the movable cart is docked.

If there are readings other than 0,0 at initialization, this will be interpreted as an offset from a home position, which can be compensated for by the controller software of the assembly apparatus or by the controller of the movable cart, or both. In one embodiment, the controller of the movable cart (including the laser) communicates with the controller of the assembly apparatus (including the sensor) by a "CAN bus" system.

In one embodiment, the sensor is a DL100-7 PCBA3 sensing diode offered by First Sensor AG of Berlin, Germany. The sensor is configured to have a duo-lateral position sensing module composed of a 10 mm×10 mm active area position sensing photodiode and associated circuitry. The sensing diode is configured to sense the position of a light spot on the surface of the photodiode and provides the voltage analogs of both axes and laser spot intensity of both axes.

In one embodiment, the laser is a VLM-635/650-02 Series offered by Infiniter Laser of Diamond Bar, Calif. The laser is an industrial, red-dot laser, having an adjustable focus range, e.g., 100 mm to infinity.

In one embodiment, the movable cart can be configured with one or more devices used to transport items from the movable cart to the assembly apparatus and from the assembly apparatus to the movable cart. For example, the device can include grippers to engage items, such as a substrate tooling tray, to move the tooling tray from the assembly apparatus to a tray of the movable cart and to move a different tooling tray from the movable cart to the assembly apparatus.

In one embodiment, the movable cart includes wheels that are driven by a suitable motor and drive train, and a control configured to control the movement of the movable cart. The movable cart further includes a power source, for example a battery, to power the movement of the movable cart via the motor and drive train.

In some embodiments, the movable cart includes a controller that is adapted to control the operation of the movable cart based on operational parameters obtained by the controller. The controller can be configured to communicate with the controller of the assembly apparatus and/or a controller associated with the production line. In one embodiment having multiple movable carts, the controller may embody a plurality of controllers provided in each movable cart that communicates with one another over a controller area network (CAN) Bus or other type of network. In other embodiments, a master controller may be provided to control the operation of the controllers of the movable carts. Each movable cart may be provided with a display, which is operably coupled to the controller. The display is adapted to display the operational parameters of the movable cart, such as, but not limited to, the number of full and spent/used paste cartridges. Suitable monitors may be provided to acquire such information. Alternatively, or in addition to the foregoing embodiment, the operational parameters may be displayed on the display provided within the assembly apparatus and/or a display associated with the production line.

In other embodiments, the controller can be a controller dedicated to one or more movable carts.

In some embodiments, material identification for items on the movable cart can include a device to manipulate the item and a scanner to scan and identify the item. For example, for paste cartridges, the movable cart can be configured to include a pinch wheel to rotate the paste cartridge to align a code or predetermined identification mark provided on the paste cartridge with scanner provided on the movable cart. The system is configured to tie material identification associated with the paste cartridge to a recipe, production time, etc., for the assembly apparatus. In one embodiment, a barcode to identify the items can be implemented. For example, the barcode can include a 1D scanner for UPC codes, a 2D scanner for QRC codes, a printed label applied on the item or a laser etched label etched on the item. In another embodiment, an RFID system to identify the items can be implemented. For example, the RFID system can include an RFID tag applied to the item and an RFID reader associated with the movable cart. With an RFID system, line-of-site between the reader and the item is not required. Moreover, scanning is not required to identify all items within the movable cart. In another embodiment, an imaging or vision system to identify the items can be implemented. The vision system could be an imaging system similar to the imaging system associated with the stencil printer or the dispenser, or on the movable cart.

In some embodiments, a database is provided to keep track of items stocked on the movable cart. In one embodiment, the database may include an open application (App) architecture and be configured to push data to the assembly apparatus. The movable cart can be configured to communication with the assembly apparatus to push/pull data to assembly apparatus and/or the production line or configured to communicate with the production line directly. The database can include job information or material information. The database further can communicate with a manufacturing execution system (MES) associated with the production line, the assembly apparatus, or both. The MES system can be configured to know which materials are required for a production run. The movable cart can be configured to communicate with the MES system to adjust delivery of items to the assembly apparatus.

The database further can be configured to retrieve information about items based on identification, e.g., a barcode number. In one embodiment, a central management system can be provided in which the assembly apparatus and/or the movable cart is programmed to accept material coming from movable cart. The movable cart is programmed to update the database to identify the materials on the movable cart, load information into the database associated with the movable cart and/or the assembly apparatus from a network, which is tied back to the MES system.

The database further can be configured to store additional information, such as usage and consumption. The database can be configured to store information locally or remotely, and can be configured to store data associated with one or more production runs. For example, the database can be configured to obtain and store data including but not limited to traceability of stencils, paste cartridges, squeegee blades and tooling, paste usage, cycles, etc.

The database can be configured to share prediction data when replacement/replenishment is needed. For example, with respect to storing information related to paste cartridges, the database can be configured to perform one or more of the following: store information on when paste cartridges need replenishment; perform a certain function if a paste cartridge is low on paste; trigger an alarm and/or a report that the paste cartridge is low; signal to an inventory control system associated with the assembly apparatus and/or the production line; perform analytics on consumable usage based on operating parameters and actual use and upstream/downstream equipment activity; predict change-out or maintenance (on the assembly apparatus and/or on the movable cart); and correlate over multiple sites to predict when to switch out paste cartridges. The database can be configured to share prediction data for other changeable/consumable items, such as for the stencils, paste cartridges, squeegee blades and tooling.

The database can be configured to store data associated with lot traceability. In addition, RFID or mechanical keying of a board or a stencil frame of the stencil is provided to ensure correct alignment/orientation/direction/front-back/top-bottom when these items are inserted into the assembly apparatus. This information can be used to verify correct orientation and/or fit before the items are transported from the warehouse and/or before the items are installed in the assembly apparatus. A low-cost reader can perform this function.

In one embodiment, a remote control can be configured to communicate with a database via the cloud or ISP to provide the functions described above. In another embodiment, the database can be part of a computer control system for the assembly apparatus or the movable cart or the production line.

In some embodiments, the movable cart can be configured to store materials. The movable cart can be configured to be flexible to accommodate where the materials come from and where the materials go to. In addition, the movable cart can be configured to identify where a particular material is located on the movable cart. In certain embodiments, the location, whether by auto delivery or manual delivery, is remote, local, on the movable cart, and/or on the assembly apparatus. As mentioned above, the movable cart can be configured to control environmental parameters. For example, the movable cart can be configured to control temperature for paste contained within paste cartridges by chilling stored paste cartridges, heating paste cartridges ready for use, and chilling paste cartridges that have been used, but still retain paste. In one embodiment, the housing can be insulated and a cooling/heating unit can be provided to cool or heat the interior of the housing and thus the paste cartridges. The movable cart further can be configured to predict when to start heating/chilling paste cartridges based on upcoming production, track time for shelf life, and individually control each paste cartridge to proper temperature and at correct time. In other embodiments, the movable cart can include a cartridge shooter to move paste cartridges. The movable cart further can be configured to control humidity to avoid condensate. The movable cart further can be configured to operate in a clean environment, e.g., a standard mechanical interface (SMIF) environment.

In some embodiments, the movable cart can be configured to perform inventory control. Specifically, the movable cart can be configured to identify where material is located, how much material is used, how the material is used, when the material is used, tie the material and information about the material to a customer inventory control system, and track material type consumed per board or lots of boards.

In some embodiments, the movable cart can be configured to organize items stored on the movable cart. As mentioned above, in one embodiment, one movable cart can be provided to store, transport and deliver multiple resources, including but not limited to paste cartridges. In another embodiment, the movable cart can be configured to store, transport and deliver a single resource or item to the assembly apparatus. The movable cart can be configured to service multiple production lines. In another embodiment, the movable cart can be configured to service one assembly apparatus.

In some embodiments, the movable cart can be configured to transport items from the movable cart to the assembly apparatus and from the assembly apparatus to the movable cart, and be able to account for elevation differences between the movable cart and the assembly apparatus. The transportation can be automated or manual. In one embodiment, movable cart can be moved by automatically guided vehicle (AVG) technology associated with the movable cart or remotely controlled. In another embodiment, the movable cart can be configured to move autonomously. In another embodiment, the movable cart can be configured to be moved manually. In yet another embodiment, the movable cart can be configured to move items stored on the movable cart automatically and/or manually. For example, the movable cart can be configured to move items automatically, and can provide for an interruption of a pre-planned activity in which the items are moved manually.

In some embodiments, timing associated with performing transportation functions of the movable cart can be programmed to account for shift change, e.g., a personnel shift, scheduled maintenance, on demand activities, e.g., a recipe change, and predictive events (just-in-time replacements). The timing can be programmed to meet multiple line balance control requirements, with one or more movable carts and to meet real-time on-demand material supply demands on the production line.

In some embodiments, the movable cart is configured to perform inspection. For example, the movable cart can inspect on cart and off cart items including stencils, paste cartridges, squeegee blades, and tooling. In one embodiment, a vision system associated with the movable cart can be configured to obtain images of the items. The vision system in conjunction with the controller, can be configured to inspect for cleanliness, damage, wear, and identification readability, e.g., is the barcode label worn, dirty or torn. The vision system can embody any type of 2D, 3D or color camera.

In some embodiments, the movable cart is configured to interface with the assembly apparatus, both from a mechanic interface and an electronics communication interface. In one embodiment, the movable cart can be configured with a unique mechanical interface that mates with a unique mechanical interface of the assembly apparatus. The unique mechanical interfaces can be geometric features. In another embodiment, the movable cart can be configured with pins that are received within guides associated with the assembly apparatus to register the movable cart with the assembly apparatus prior to fully docking the movable cart. The pins and guides can be reversed, with the pins provided on the assembly apparatus and the guides provided in the movable cart. Other types of guides can be used, such as electrical/magnetic guides, vision guides, sensors, latches, etc.

In some embodiments, the interface and the docking station can be configured with a clamping system to maintain the movable cart in place with respect to the assembly apparatus. For example, a magnetic clamping system can be employed.

In some embodiments, the assembly apparatus can be configured with multiple docking stations, e.g., five docking stations. The docking station can be provided at a front of the assembly apparatus or at a back of the assembly apparatus.

The movable cart and/or the assembly apparatus can be configured to verify whether the movable cart can be docked and interface with the assembly apparatus. In one embodiment, verification can be provided to confirm that the movable cart is in position and ready to interface with the assembly apparatus. This verification process can further determine whether correct materials are on the movable cart and whether the movable cart material information can be received from MES system, or locally identified. If not correct, the movable cart can be configured to activate an alarm and/or alert an operator if wrong or damaged materials are on the movable cart.

In some embodiments, the movable cart can be configured with actuation devices or actuators to move items onto and off of the movable cart once the movable cart is docked to the assembly apparatus. Embodiments of the actuators can be implemented on the movable cart, the assembly apparatus or both. In another embodiment, the items can be manually loaded and unloaded from the movable cart.

In some embodiments, the movable cart can be configured to interface with a production line. With this embodiment, the operator of the production line can confirm the correct location and acknowledge receipt of the movable cart on the assembly apparatus.

In some embodiments, the movable cart can be configured to communicate with the assembly apparatus, the production line, and/or select machines within the production line via an open platform. Communication systems can include a wired system, a wireless system (through a common network, mesh, Bluetooth, Wi-Fi, Zigbee, WAN, Nodes, Li-Fi, etc.), a combination of wired and wireless systems, and infrared (IR) system.

In some embodiments, the movable cart can be configured with a dedicated power source. In one embodiment, the movable cart includes a battery configured to power automated components provided in the movable cart, e.g., mechanisms used to move stencils into and out of the movable cart, mechanisms used to move paste cartridges into and out of the movable cart, mechanisms used to move squeegee blades into and out of the movable cart, and mechanisms used to move tooling into and out of the movable cart. In other embodiments, the movable cart can be configured with an uninterruptible power supply. The power source can be configured to support actuation while "docked" (high-voltage from assembly apparatus when docked, otherwise low-voltage when undocked). The power source can be configured to recharge for autonomous operations, e.g., recharge a battery from power provided by the assembly apparatus.

In some embodiments, the movable cart can be configured to function with the assembly apparatus. For example, the movable cart can be configured to provide a handshaking function with the assembly apparatus prior to a transfer of an item, e.g., "please give me paste cartridge #1234." The movable cart and the assembly apparatus can be configured with a communication protocol and/or a library reference on what is available to consume. The movable cart can be configured to determine whether the movable cart has correct items. The handshaking function can be configured to ensure the correct transfer of an item, e.g., "here's paste cartridge #1234," and/or the subsequent transfer of an item, e.g., "I now have paste cartridge #1234." In one embodiment, a mobile device can be configured to scan and identify items in the movable cart, and determine, for example, whether the items are ready for use, require cleaning, etc.

In some embodiments, the movable cart can be configured to address errors associated with handling and recovering items in the movable cart. For example, the movable cart can be configured to detect an incomplete action by one party, an incomplete transfer of an item, e.g., a stuck or jammed item, a dropped transfer, e.g., "I passed paste cartridge #1234 to you, don't you have it?," and a manual intervention or override, e.g., "here, let me help you." In one embodiment, a controller associated with the movable cart can be configured to perform static discharge control, data recovery and/or security.

In some embodiments, the movable cart can be configured with a higher level of capability. In addition to indexing all the equipment to the correct height, the movable cart would need to pull in/push out all equipment for machine gantries to attach.

In some embodiments, existing machine gantries, rails and print head of the assembly apparatus can be configured to shuttle items in and out.

In some embodiments, the movable cart can be configured with a paste cartridge indexer to load/unload paste cartridges.

In some embodiments, the movable cart can be configured to communication with the assembly apparatus, the production line and a warehouse associated with the production line.

In some embodiments, the movable cart can be configured with an electrical/pneumatic interface.

In some embodiments, the movable cart can be configured to track consumables—new and used on the movable cart, e.g., solder paste cartridges, including location, temperature and other data.

In some embodiments, the movable cart can be configured to scan all consumables with a suitable scanning device, such as a barcode reader or RFID reader.

In some embodiments, the movable cart can be configured with an indexing mechanism to properly locate consumables.

In some embodiments, the movable cart can be configured with a bypass switch to disconnect the movable cart from the assembly apparatus if the movable cart has an issue.

In some embodiments, the movable cart can be configured to be climate controlled, either actively or passively.

In some embodiments, the movable cart can be configured be controlled by an application (App) capable for smartphone integration.

As used herein, an "automated" or "fully automated" changeover describes the replacement or replenishment of an item without human intervention.

As used herein, a "partially automated" changeover describes the replacement or replenishment of an item with some or limited human intervention.

As used herein, "transport" or "transporting" describes moving an item from one position to another, either manually or with a machine.

As used herein, "install" or "installing" describes the process of placing an item in a position ready for use.

The concepts disclosed herein may be employed in other types of equipment used to fabricate electronic substrates, including pick-and-place machines, reflow ovens, wave soldering machines, selective solder machines, inspection stations, and cleaning stations. For example, the concepts directed to replacing tooling can be employed in pick-and-place machines used to mount electronic components onto electronic substrates. In another example, the concepts directed to replacing items can be employed in replacing solder within wave soldering and selective soldering machines and cleaning product within cleaning stations.

Having thus described several aspects of at least one embodiment, it is to be appreciated various alterations, modifications, and improvements will readily occur to those skilled in the art. Such alterations, modifications, and improvements are intended to be part of this disclosure, and are intended to be within the scope of the disclosure. Accordingly, the foregoing description and drawings are by way of example only.

What is claimed is:

1. A system for aligning a movable cart to an assembly apparatus, the assembly apparatus having at least one item of a plurality of items for replacement within the assembly apparatus, the assembly apparatus including a docking station, the movable cart being configured to receive a used item or provide a new item to the assembly apparatus, the movable cart including an interface configured to dock within the docking station of the assembly apparatus, the system comprising:
   a sensor associated with the assembly apparatus; and
   a laser associated with the movable cart,
   wherein the sensor and the laser are configured to align the movable cart with the assembly apparatus after an initial docking of the movable cart within the docking station of the assembly apparatus, and
   wherein the laser is calibrated to one side of the movable cart to ensure that the laser emits a beam that is aligned to the x-axis, y-axis and z-axis coordinate of the movable cart.

2. The system of claim 1, wherein the sensor is mounted on a support of the assembly apparatus and the laser is mounted on a frame of the movable cart.

3. The system of claim 2, wherein the support is configured to support a stencil within a stencil printer.

4. The system of claim 2, wherein the support is configured to hold a substrate within a dispenser.

5. The system of claim 2, wherein a position of the laser on the frame of the movable cart is at an elevation that is the same elevation of the sensor of the assembly apparatus.

6. The system of claim 1, wherein the laser is a low power laser.

7. The system of claim 1, wherein the sensor is configured to produce an output signal that can be connected to a subsystem of the assembly apparatus.

8. The system of claim 7, wherein the subsystem is a controller, and the sensor produces an output signal that is processed by the controller.

9. The system of claim 8, wherein the controller includes software that is configured to convert the output signal into x-axis and z-axis relative or absolute coordinates.

10. A method of aligning a movable cart to an assembly apparatus, the assembly apparatus having at least one item of a plurality of items for replacement within the assembly apparatus, the assembly apparatus including a docking station, the movable cart being configured to receive a used item or provide a new item to the assembly apparatus, the movable cart including an interface configured to dock within the docking station of the assembly apparatus, the method comprising:
   providing a sensor on one of the assembly apparatus and the movable cart;
   directing a laser toward the sensor, the laser being associated with the other of the assembly apparatus and the movable cart,
   wherein the sensor and the laser are configured to align the movable cart with the assembly apparatus after an initial docking of the movable cart within the docking station of the assembly apparatus, the sensor being configured to produce an output signal that can be connected to a subsystem of the assembly apparatus, and
   wherein the subsystem is a controller configured to process the output signal produced by the sensor, the controller including software that is configured to convert the output signal into x-axis and z-axis relative or absolute coordinates; and
   calibrating the laser, the laser being calibrated to one side of the movable cart to a target that will ensure that the laser emits a beam that is aligned to the x-axis, y-axis and z-axis coordinate of the movable cart.

11. The method of claim 10, wherein the sensor is mounted on the assembly apparatus in a way that the beam emitted from the laser on the movable cart will be a nominal position that the assembly apparatus will interpret as the 0,0 position for x-axis alignment and z-axis height when all axes in the assembly apparatus are in their initialized position.

12. The method of claim 11, wherein the subsystem informs the assembly apparatus that the movable cart is in a correct or proper position with respect to the assembly apparatus and that it is acceptable to perform a function.

13. The method of claim 12, wherein, if a reading other than 0,0 is detected, this is interpreted as a misalignment and the assembly apparatus or the movable cart can make the necessary adjustments to get back to a 0,0 reading to signal proper alignment of the movable cart and the assembly apparatus when the movable cart is docked.

14. The method of claim 13, wherein if there are readings other than 0,0 at initialization, this will be interpreted as an offset from a home position, which can be compensated for by the controller software of the assembly apparatus or by the controller of the movable cart, or both.

* * * * *